(12) United States Patent
Wang

(10) Patent No.: US 11,615,965 B2
(45) Date of Patent: Mar. 28, 2023

(54) SEMICONDUCTOR FINFET DEVICE AND METHOD

(71) Applicant: Taiwan Semiconductor Manufacturing Co., Ltd., Hsinchu (TW)

(72) Inventor: Chih-Yu Wang, Taichung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/012,525

(22) Filed: Sep. 4, 2020

(65) Prior Publication Data

US 2020/0402807 A1   Dec. 24, 2020

Related U.S. Application Data

(62) Division of application No. 16/277,023, filed on Feb. 15, 2019, now Pat. No. 10,770,302.

(60) Provisional application No. 62/737,780, filed on Sep. 27, 2018.

(51) Int. Cl.
| | | |
|---|---|---|
| *H01L 21/308* | (2006.01) | |
| *H01L 21/311* | (2006.01) | |
| *H01L 27/092* | (2006.01) | |
| *H01L 29/78* | (2006.01) | |
| *H01L 21/8238* | (2006.01) | |

(52) U.S. Cl.
CPC ...... *H01L 21/3086* (2013.01); *H01L 21/3081* (2013.01); *H01L 21/31116* (2013.01); *H01L 21/823821* (2013.01); *H01L 27/0924* (2013.01); *H01L 29/7853* (2013.01)

(58) Field of Classification Search
CPC ............ H01L 21/3086; H01L 21/3081; H01L 21/31116; H01L 21/823821; H01L 27/0924; H01L 29/7853
See application file for complete search history.

(56) References Cited

U.S. PATENT DOCUMENTS

| | | | |
|---|---|---|---|
| 6,238,981 B1 | 5/2001 | Grebs | |
| 7,268,396 B2 | 9/2007 | Lee et al. | |
| 9,362,179 B1 | 6/2016 | Cheng et al. | |

(Continued)

FOREIGN PATENT DOCUMENTS

| | | |
|---|---|---|
| CN | 101621074 A | 1/2010 |
| CN | 102820230 A | 12/2012 |

(Continued)

*Primary Examiner* — Timor Karimy
(74) *Attorney, Agent, or Firm* — Slater Matsil, LLP

(57) ABSTRACT

A method includes depositing a mask layer over a semiconductor substrate, etching the mask layer to form a patterned mask, wherein a sidewall of the patterned mask includes a first sidewall region, a second sidewall region, and a third sidewall region, wherein the first sidewall region is farther from the semiconductor substrate than the second sidewall region and the second sidewall region is farther from the semiconductor substrate than the third sidewall region, wherein the second sidewall region protrudes laterally from the first sidewall region and from the third sidewall region, etching the semiconductor substrate using the patterned mask to form fins, forming a gate stack over the fins, and forming source and drain regions in the fin adjacent the gate stack.

20 Claims, 41 Drawing Sheets

(56) References Cited

U.S. PATENT DOCUMENTS

| | | | |
|---|---|---|---|
| 10,153,280 B2 | 12/2018 | Chiang et al. | |
| 10,269,793 B2 | 4/2019 | Chang et al. | |
| 10,269,968 B2 | 4/2019 | Chen et al. | |
| 2005/0208715 A1 | 9/2005 | Seo et al. | |
| 2010/0001340 A1 | 1/2010 | Lee et al. | |
| 2012/0313170 A1 | 12/2012 | Chang et al. | |
| 2014/0239354 A1 | 8/2014 | Huang et al. | |
| 2014/0308785 A1* | 10/2014 | Yeh | H01L 29/66795 438/238 |
| 2015/0147861 A1* | 5/2015 | Park | H01L 29/66545 438/283 |
| 2015/0171187 A1* | 6/2015 | Huang | H01L 29/7853 438/283 |
| 2015/0372110 A1 | 12/2015 | Zhao | |
| 2016/0204245 A1 | 7/2016 | Jangjian et al. | |
| 2016/0240444 A1 | 8/2016 | Chao et al. | |
| 2016/0380056 A1* | 12/2016 | Yeo | H01L 29/0653 438/283 |
| 2017/0062211 A1 | 3/2017 | Lim et al. | |
| 2017/0084616 A1* | 3/2017 | Kim | H01L 29/7854 |
| 2017/0250282 A1* | 8/2017 | Wu | H01L 29/785 |

FOREIGN PATENT DOCUMENTS

| | | |
|---|---|---|
| CN | 103413758 A | 11/2013 |
| CN | 105895528 A | 8/2016 |
| CN | 106252231 A | 12/2016 |
| CN | 106486380 A | 3/2017 |
| CN | 106653606 A | 5/2017 |
| CN | 107424934 A | 12/2017 |
| KR | 20050047276 A | 5/2005 |
| KR | 20050092933 A | 9/2005 |
| KR | 20140107075 A | 9/2014 |

\* cited by examiner

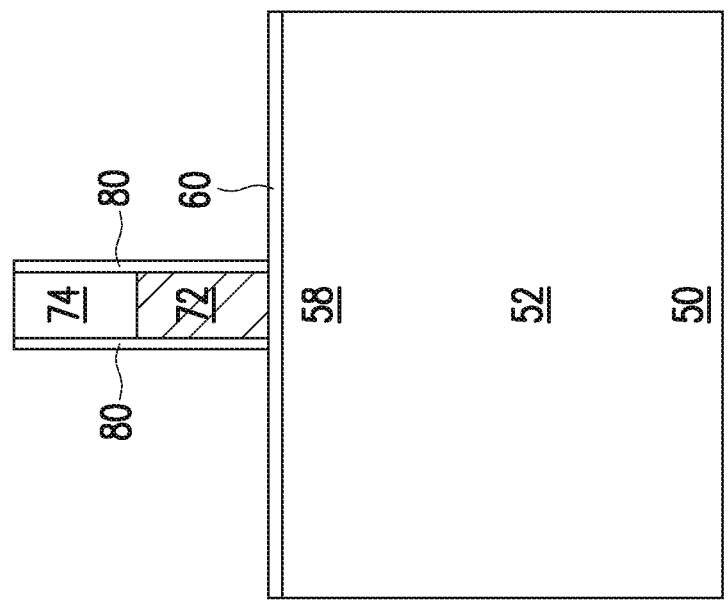
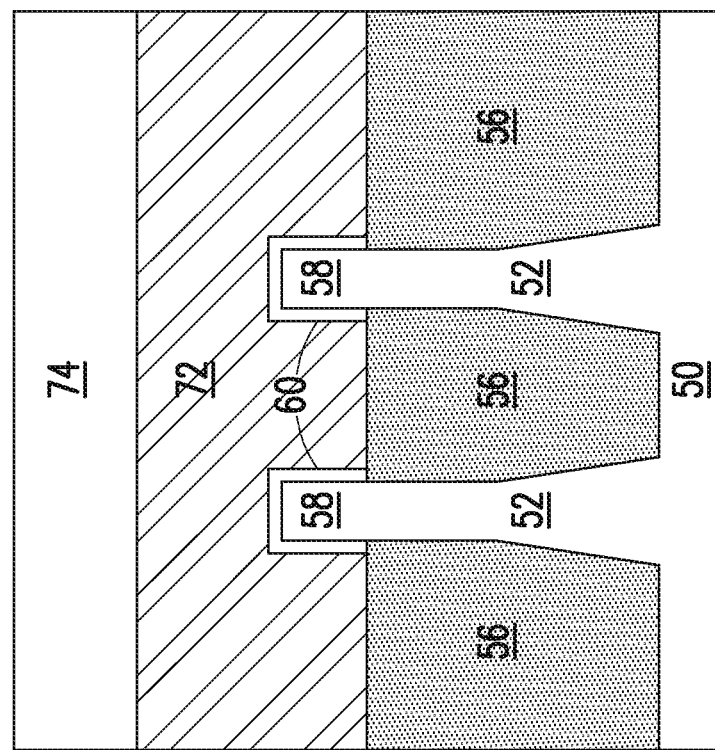
FIG. 12B
FIG. 12A

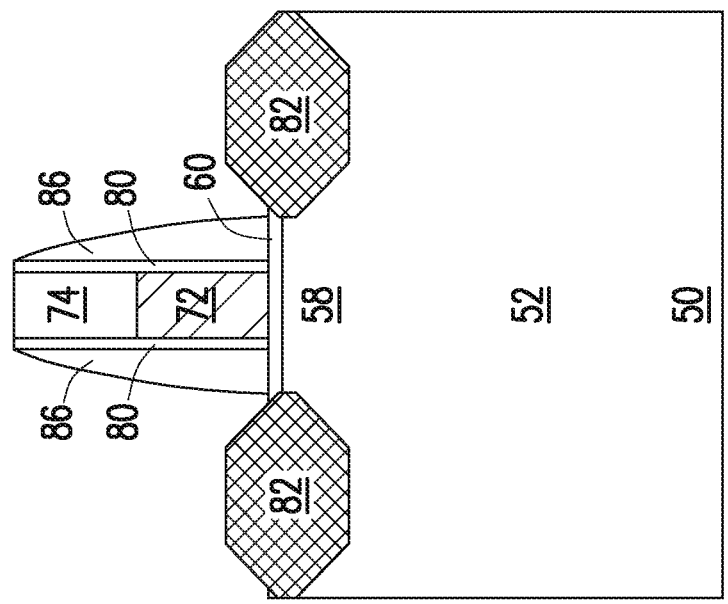
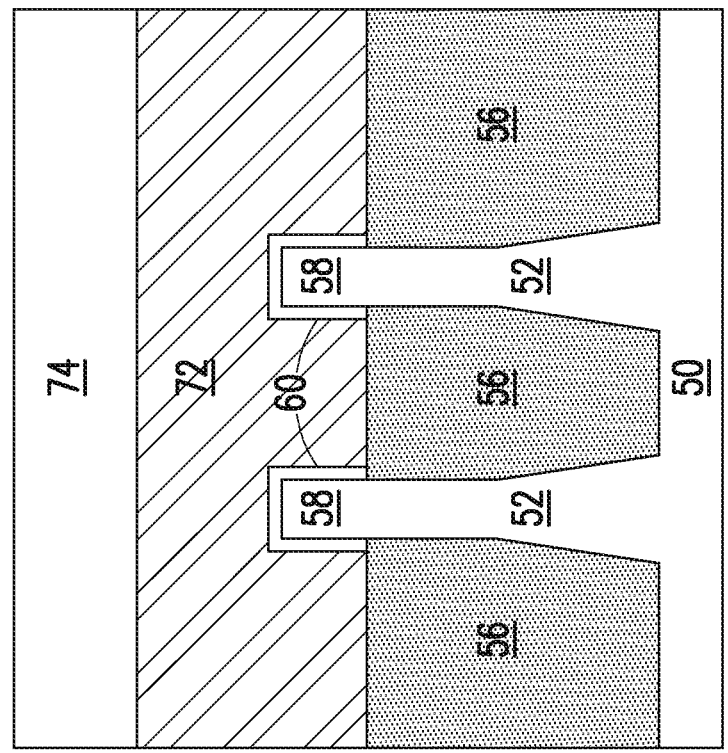
FIG. 14B
FIG. 14A

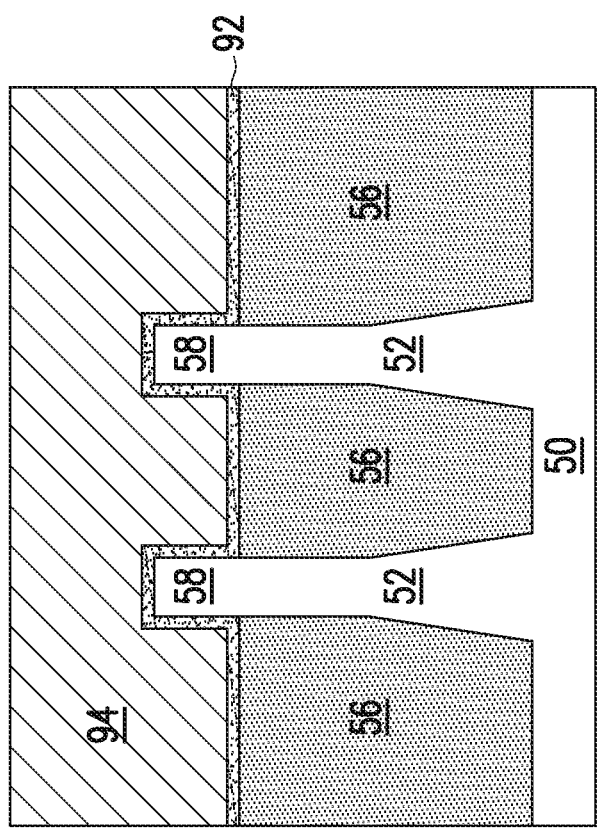
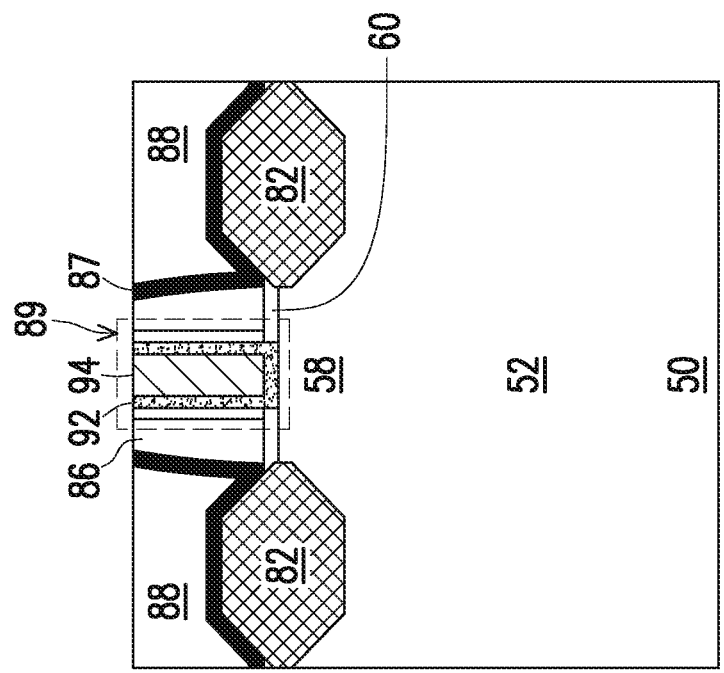
FIG. 18A
FIG. 18B

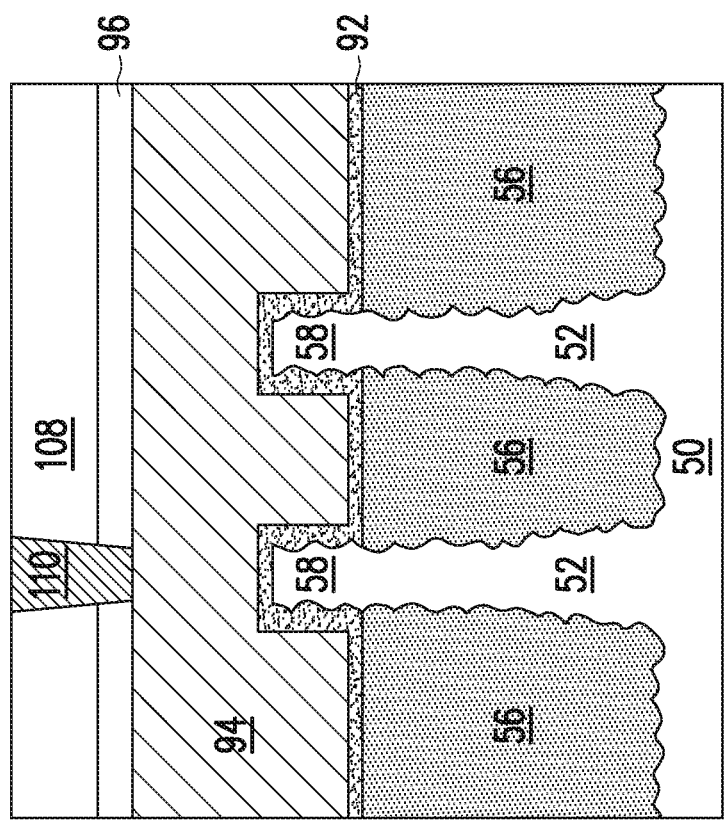
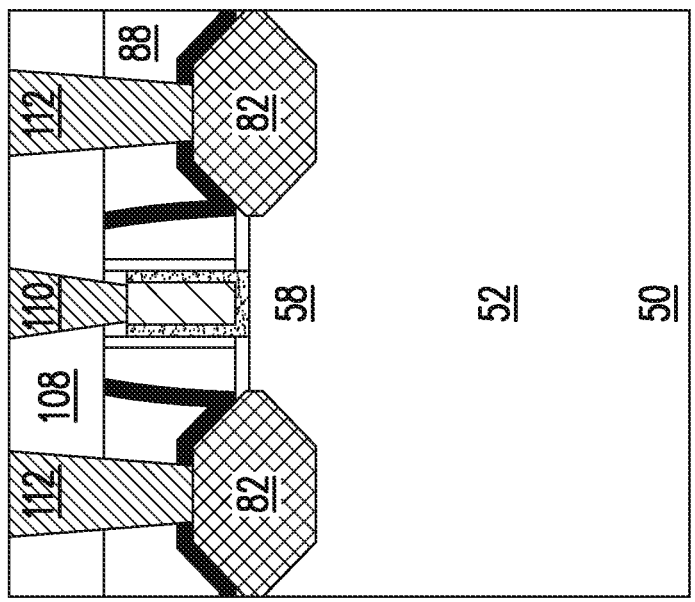
FIG. 36A
FIG. 36B

SEMICONDUCTOR FINFET DEVICE AND METHOD

PRIORITY CLAIM AND CROSS-REFERENCE

This application is a divisional of U.S. patent application Ser. No. 16/277,023, filed on Feb. 15, 2019, entitled "Semiconductor FinFET Device and Method," which claims the benefit of U.S. Provisional Application No. 62/737,780, filed on Sep. 27, 2018 and entitled "FinFET Device and Method," which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-20B are cross-sectional views of intermediate stages in the manufacturing of FinFETs, in accordance with some embodiments.

FIGS. 29-36B are cross-sectional views of intermediate stages in the manufacturing of FinFETs, in accordance with some embodiments.

DETAILED DESCRIPTION

Figure 1:
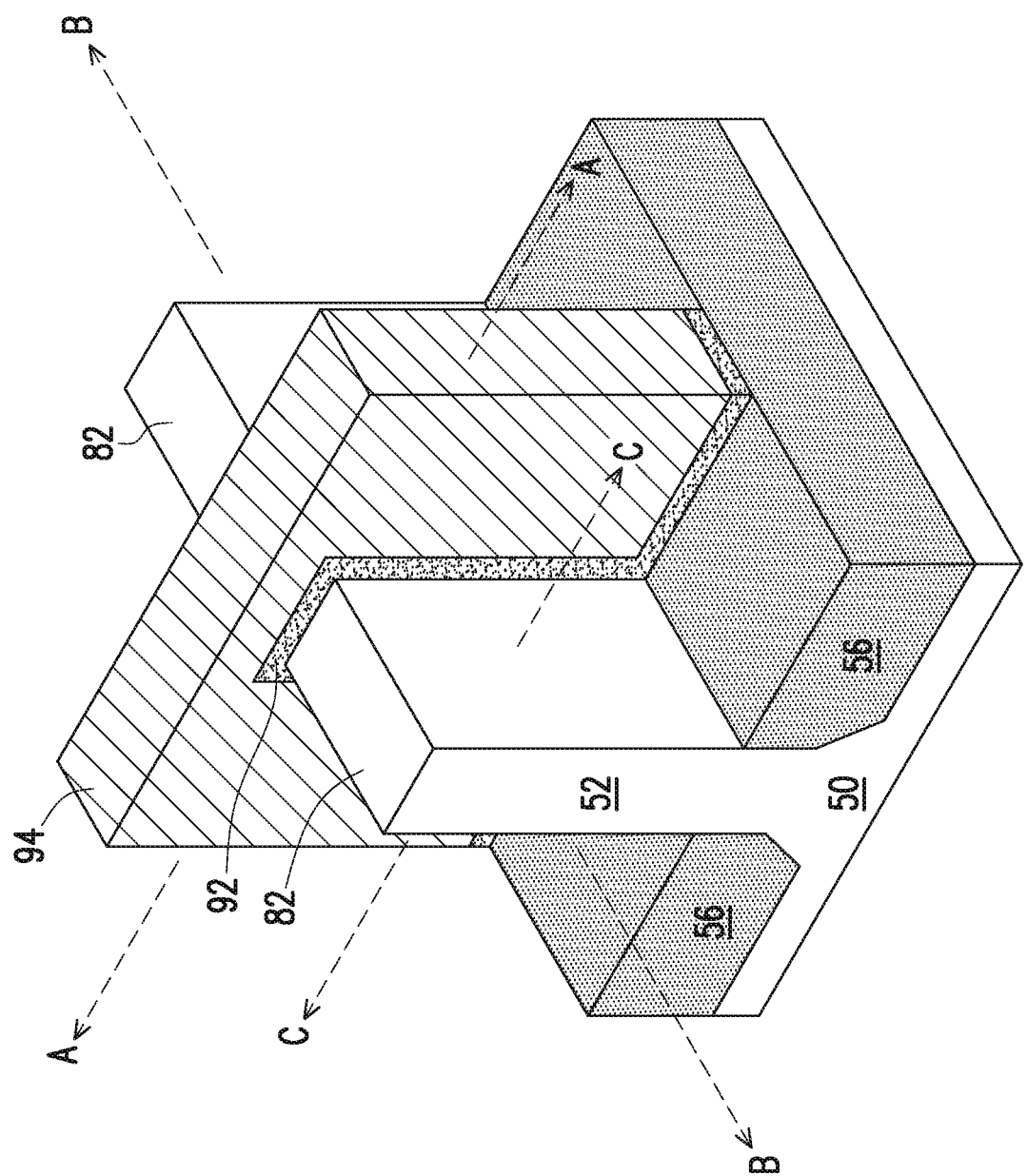
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, a FinFET device and a method of forming the same. Various embodiments discussed herein allow for the formation of semiconductor fins with a reduced chance of fins collapsing due to adhesion forces (e.g., "stiction") between adjacent fins. Embodiments described herein reduce the contact area of the fins during formation, which reduces the adhesion forces between fins. In some embodiments, hard mask regions over the fins are etched such that lateral protrusions extend outward from each hard mask region, the protrusions reducing the contact area of the hard mask regions. In some embodiments, a rough film is deposited over the fins, the roughness of the film reducing the contact area of the fins. In some embodiments, an etching process is performed on the fins to roughen the sidewalls of the fins, which reduces the contact area of the fins. In this manner, process failure due to stiction may be reduced, and thus the yield of the FinFET manufacturing process may be improved.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 20B are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. FIGS. 4, 5, 6A-C, 7A-B, 8-11, 12A, 13A, 14A, 15A, 16A, 17A, 19A, and 20A are illustrated along reference cross-section A-A illustrated in FIG. 1, and FIGS. 12B, 13B, 14B, 14C, 15B, 16B, 17B, 18B-C, 19B, and 20B are illustrated along a similar cross-section B-B illustrated in FIG. 1, except for multiple fins/FinFETs. FIGS. 14C and 14D are illustrated along reference cross-section C-C illustrated in FIG. 1, except for multiple fins/FinFETs.

Figure 2:
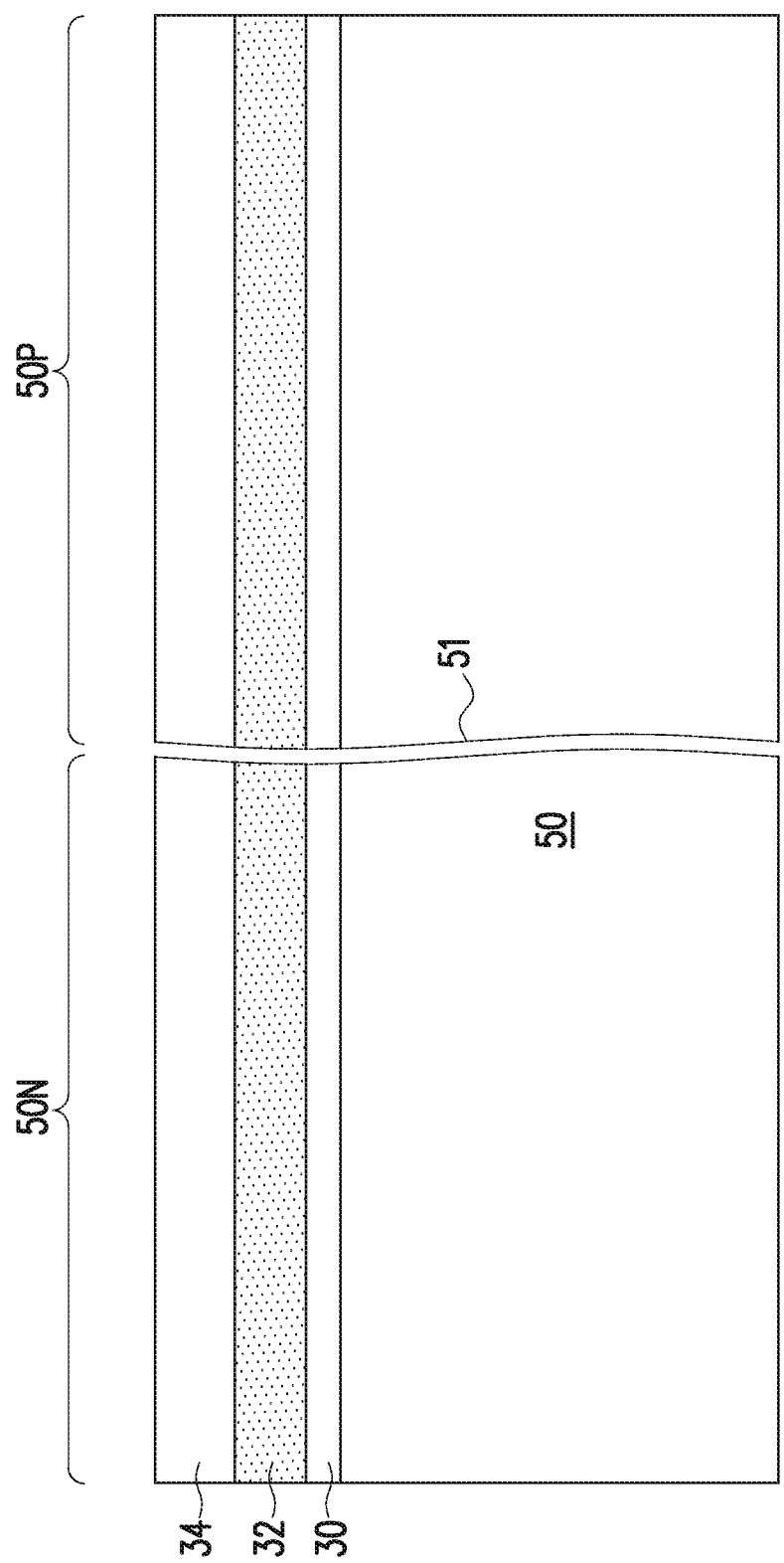

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by divider 51), and any number of device features (e.g., other active devices, doped regions, isolation structures, etc.) may be disposed between the region 50N and the region 50P.

As further illustrated by FIG. 2, a film stack is formed over a substrate 50. The film stack includes an anti-reflective coating (ARC) 30, a first mask layer 32, and a second mask layer 34. In other embodiments, the film stack may include more layers or fewer layers. A photoresist structure 36 is formed over the second mask layer 34 and used an etching mask to pattern the second mask layer 34.

In some embodiments, the ARC 30 may be formed of a material such as amorphous silicon, polysilicon, silicon nitride, silicon oxide, silicon oxynitride, the like, or a combination thereof. In an embodiment, the ARC 30 is a silicon oxide. The ARC 30 may be formed using any suitable deposition process, such as, atomic layer deposition (ALD), chemical vapor deposition (CVD), high density plasma CVD (HDP-CVD), physical vapor deposition (PVD), and the like. In some embodiments, the ARC 30 has a thickness between about 1 nm and about 10 nm.

The first mask layer 32 is formed over the ARC 30. The first mask layer 32 may be formed of material such as a metal material, a dielectric material, or a combination. The first mask layer 32 may include a metal material such as titanium nitride, titanium, tantalum nitride, tantalum, or the like. The first mask layer 32 may include a dielectric material such as silicon oxide, silicon nitride, silicon oxynitride, the like, or a combination thereof. The first mask layer 32 may be formed using a process such as ALD, CVD, PVD, or the like. In some embodiments, the first mask layer 32 has a thickness between about 10 nm and about 30 nm.

The second mask layer 34 is formed over the first mask layer 32. The second mask layer 34 may be formed of material such as a metal material, a dielectric material, or a combination. The second mask layer 34 may include a metal material such as titanium nitride, titanium, tantalum nitride, tantalum, or the like. The second mask layer 34 may include a dielectric material such as silicon oxide, silicon nitride, silicon oxynitride, the like, or a combination thereof. In some embodiments, the material of the first mask layer 32 and the second mask layer 34 are chosen such that the second mask layer 34 may have a high etching selectivity relative to the first mask layer 32. For example, in some embodiments, the first mask layer 32 may be silicon nitride and the second mask layer 34 may be silicon oxide. The second mask layer 34 may be formed using a process such as ALD, CVD, PVD, or the like. In some embodiments, the second mask layer 34 has a thickness between about 10 nm and about 100 nm.

Figure 3:
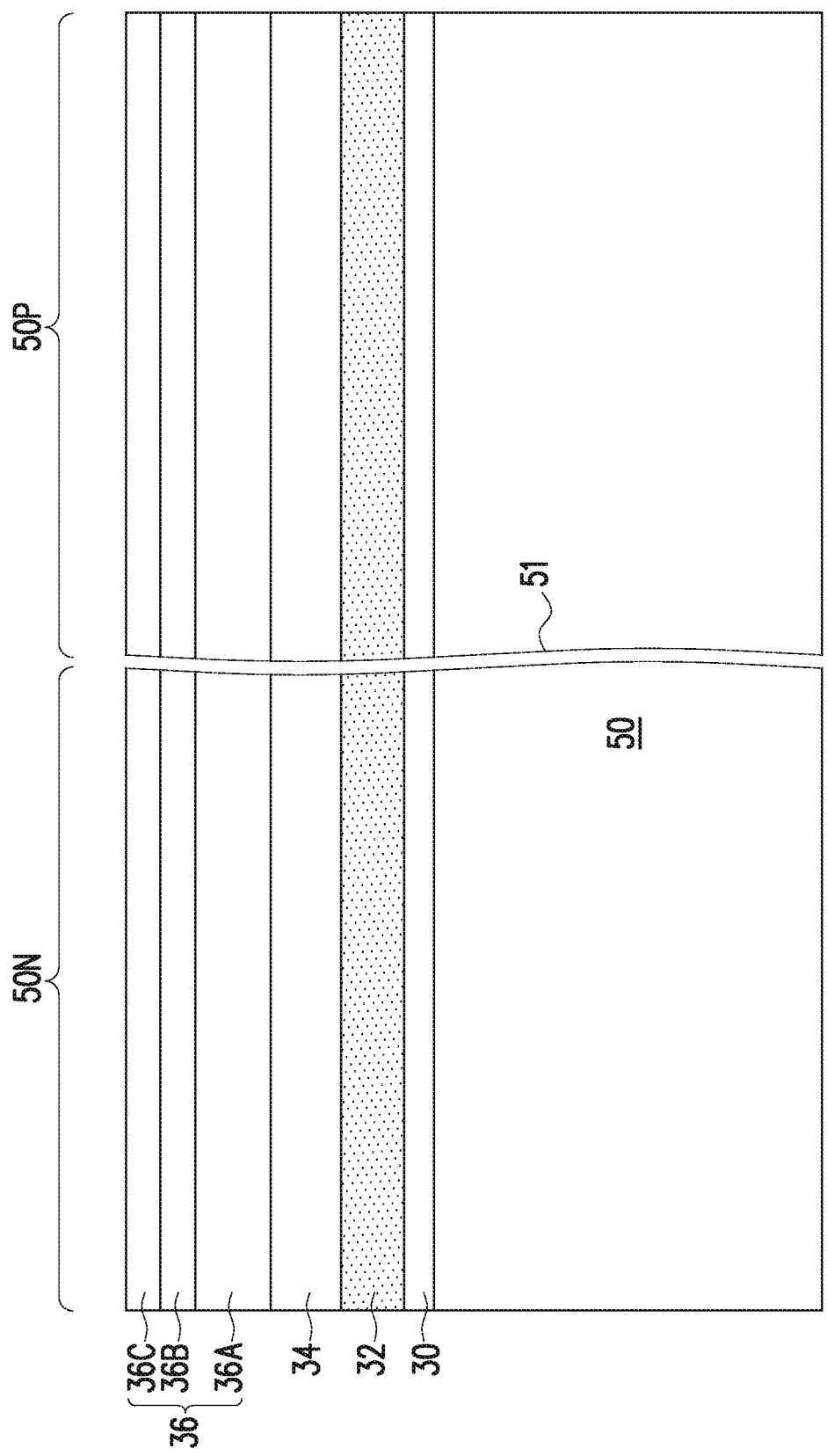

Turning to FIG. 3, a photoresist structure 36 is formed over the second mask layer 34 of the film stack. The photoresist structure 36 may be a single layer (e.g., a photoresist layer) or be a multi-layer structure (e.g., a bi-layer or tri-layer photoresist structure). For example, the photoresist structure 36 may be a tri-layer photoresist structure including a bottom layer 36A, a middle layer 36B, and an upper layer 36C, as shown in FIG. 3. The upper layer 36C may be formed of a photosensitive material, such as a photoresist, which may comprise organic materials. The bottom layer 36A may be, for example, a bottom anti-reflective coating (BARC). The middle layer 36B may be formed of or include an inorganic material, which may be a dielectric material such as nitride (such as silicon nitride), an oxynitride (such as silicon oxynitride), an oxide (such as silicon oxide), or the like. The middle layer 36B may have a high etching selectivity relative to the upper layer 36C and the bottom layer 36A. As a result, the upper layer 36C is used as an etching mask for the patterning of the middle layer 36B, and the middle layer 36B is used as an etching mask for the patterning of the bottom layer 36A. In some embodiments, the material of the bottom layer 36A of the photoresist structure 36 may have a high etching selectivity relative to the second mask layer 34. For example, in some embodiments, the bottom layer 36A may be silicon nitride and the second mask layer 34 may be silicon oxide.

Figure 4:
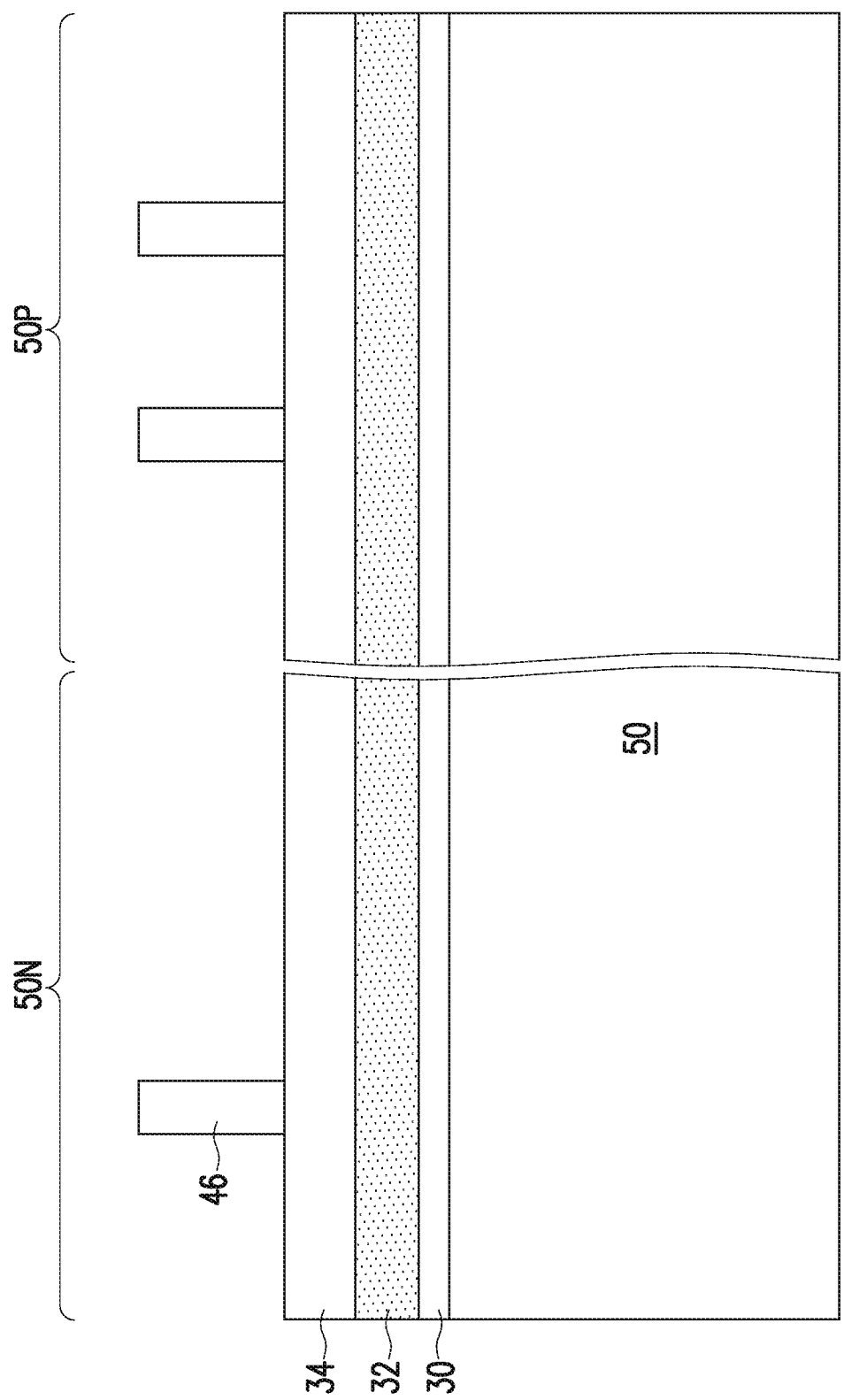

Turning to FIG. 4, the photoresist structure 36 is patterned to form etching mask 46 from the photoresist structure 36. For example, the upper layer 36C (see FIG. 3) of the photoresist structure 36 may be patterned using any suitable photolithography technique to form openings therein. After the patterning of the upper layer 36C, an etching process is performed to transfer the pattern of the openings in the upper layer 36C to the middle layer 36B. The etching process may be an anisotropic etching process, such as an anisotropic dry etching process. After the pattern of the openings is transferred to the middle layer 36B, an etching process is performed to transfer the pattern of the middle layer 36B to the bottom layer 36A. In some embodiments, the upper layer 36C may be removed during the etching process of transferring the pattern of the middle layer 36B to the bottom layer 36A. The remaining portions of the bottom layer 36A, middle layer 36B, and upper layer 36C (if present) form the etching mask 46.

Figure 5:
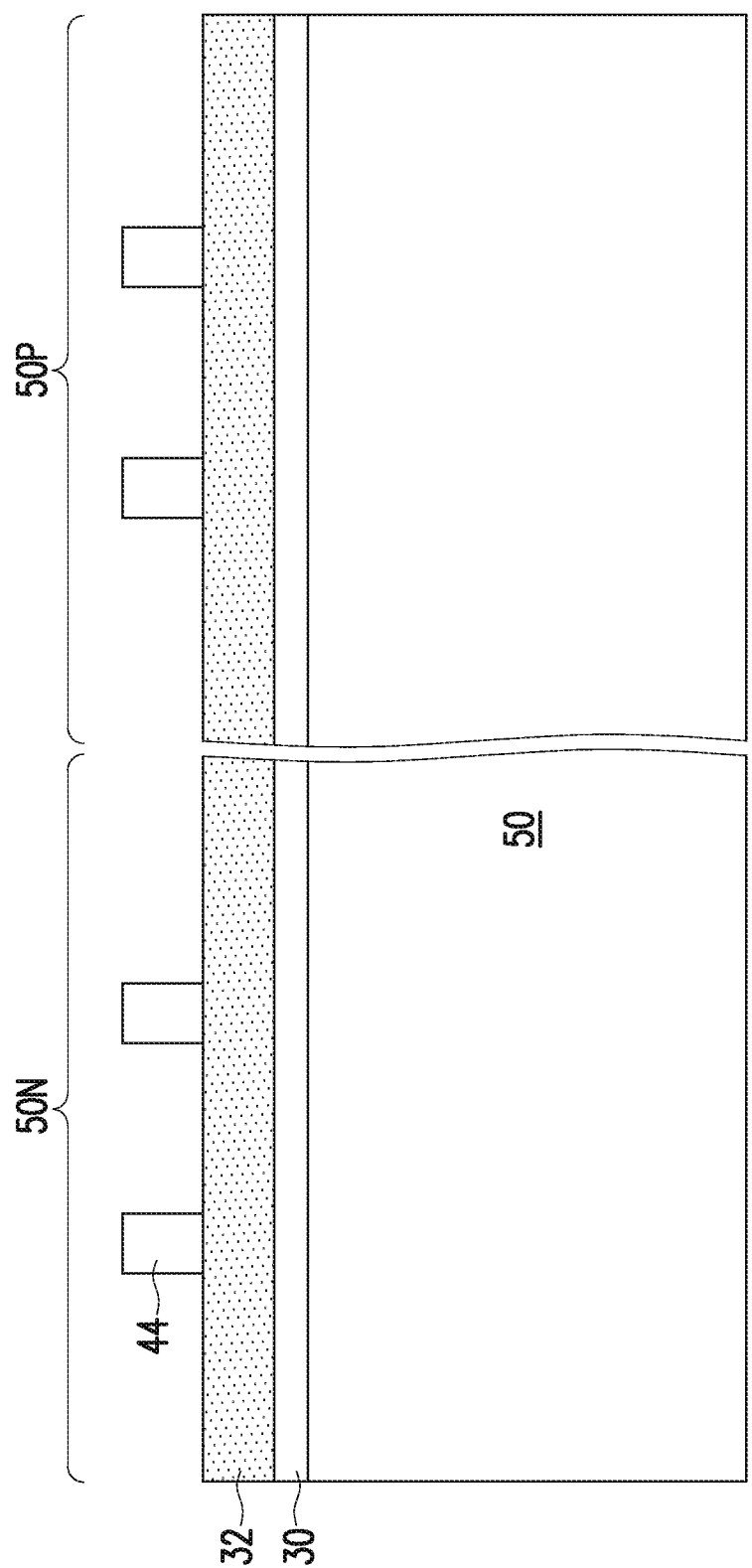

Turning to FIG. 5, an etching process is used to transfer the pattern of the etching mask 46 to the second mask layer 34, forming patterned second mask 44. The etching process may include a wet etching process and/or a dry etching process. For example, the etching process may be an anisotropic dry etching process. The etching process may be selective to the material of the second mask layer 34 over the material of the first mask layer 32.

Figure 6A:
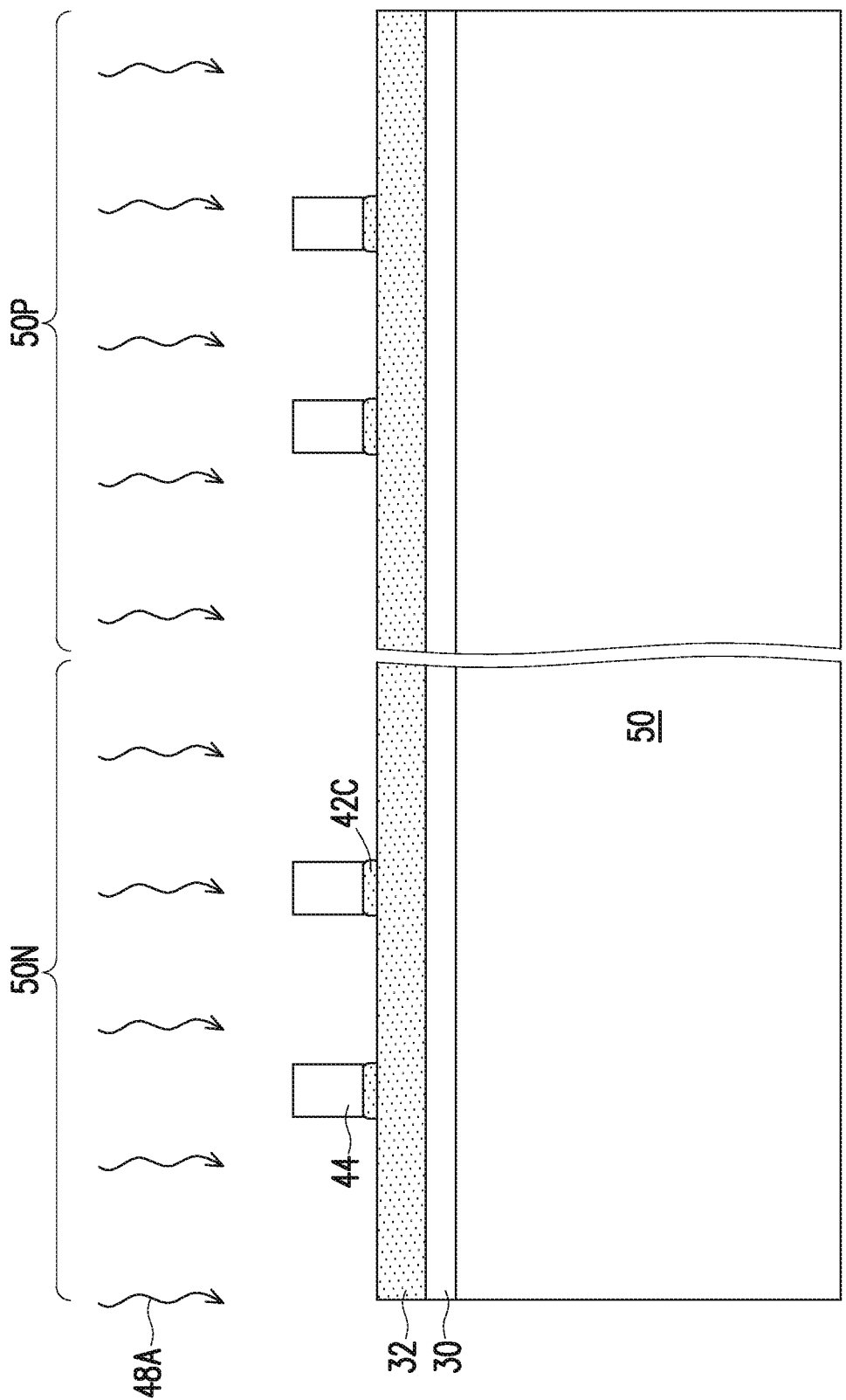
Figure 6B:
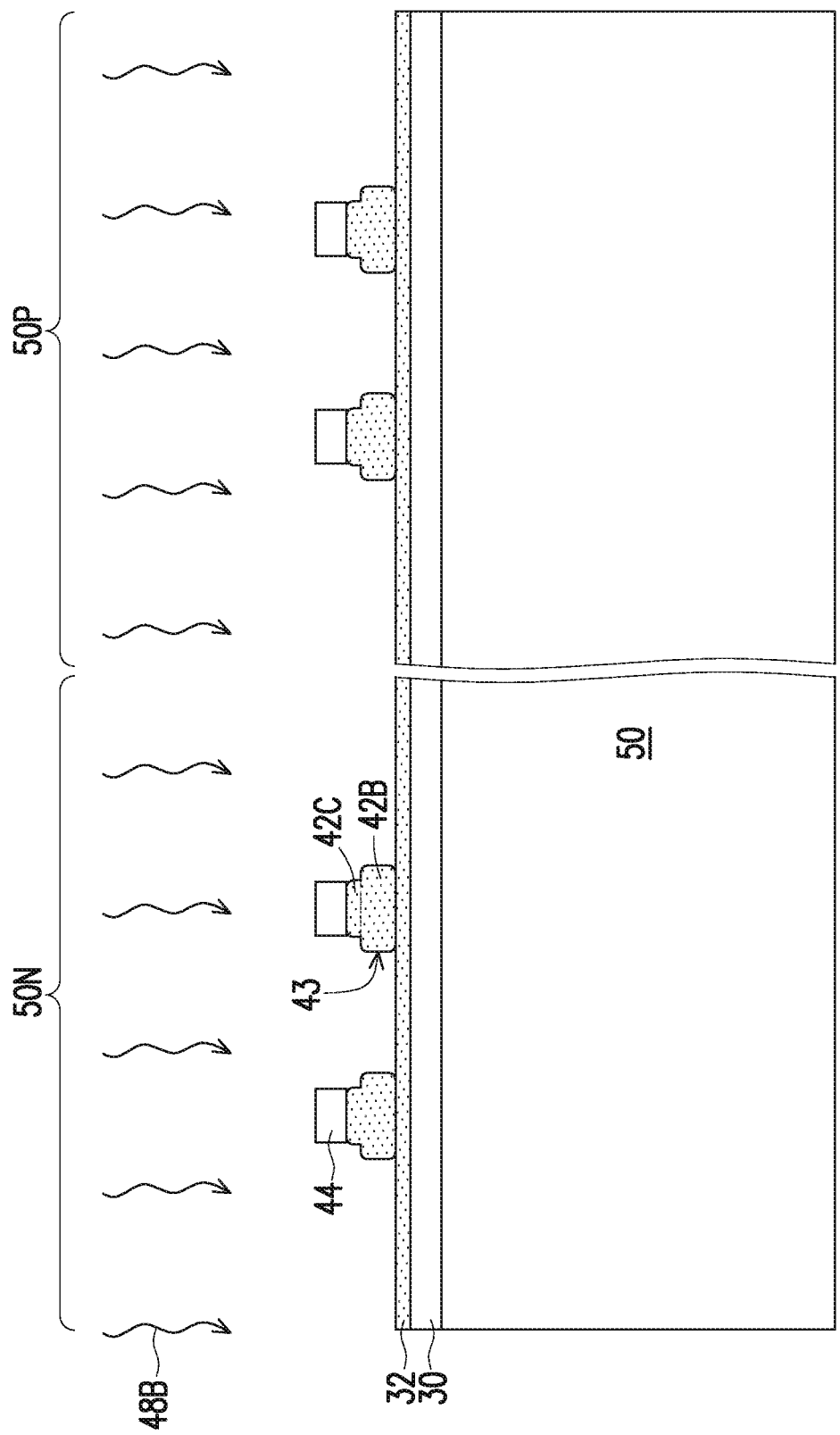
Figure 6C:
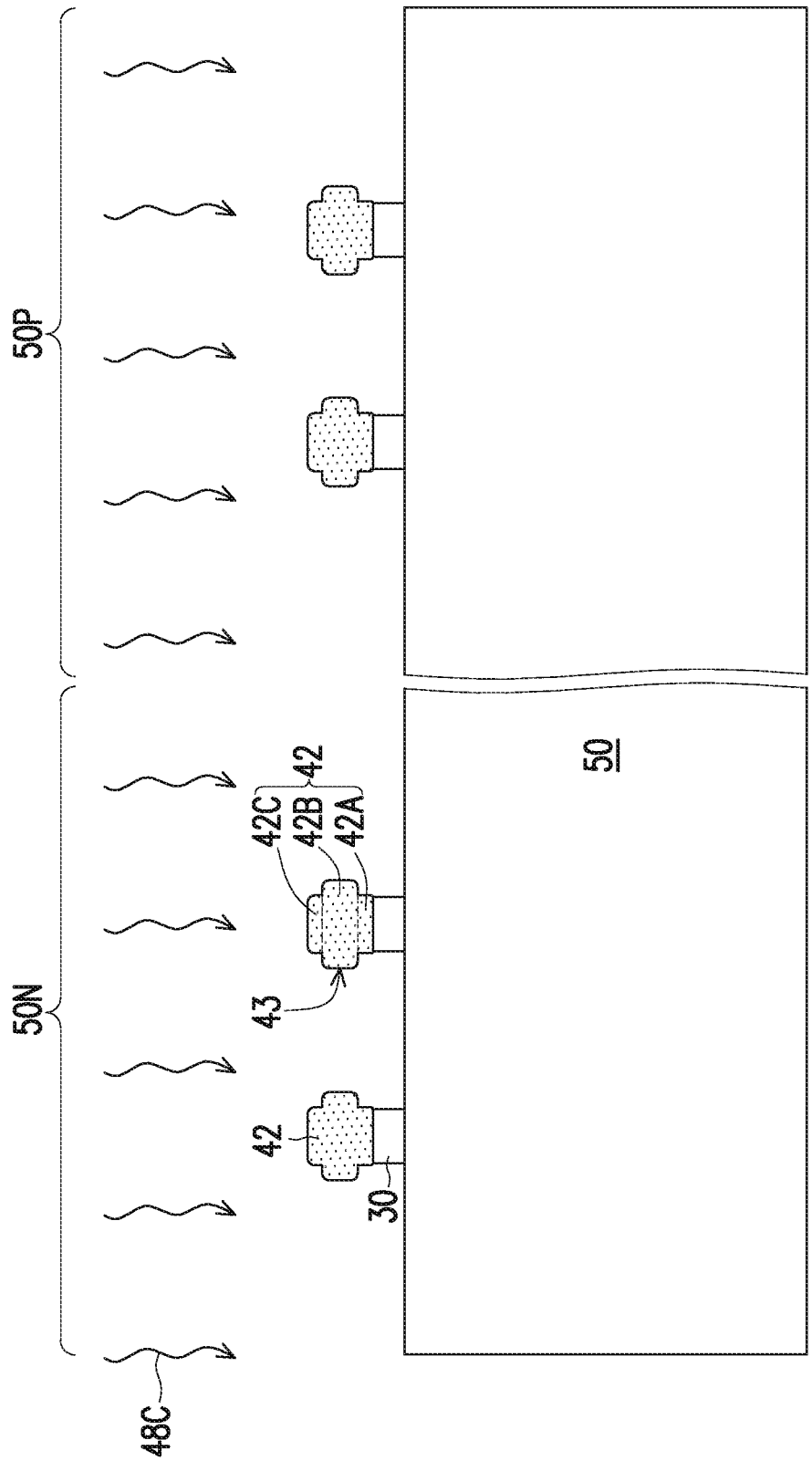
Figure 7A:
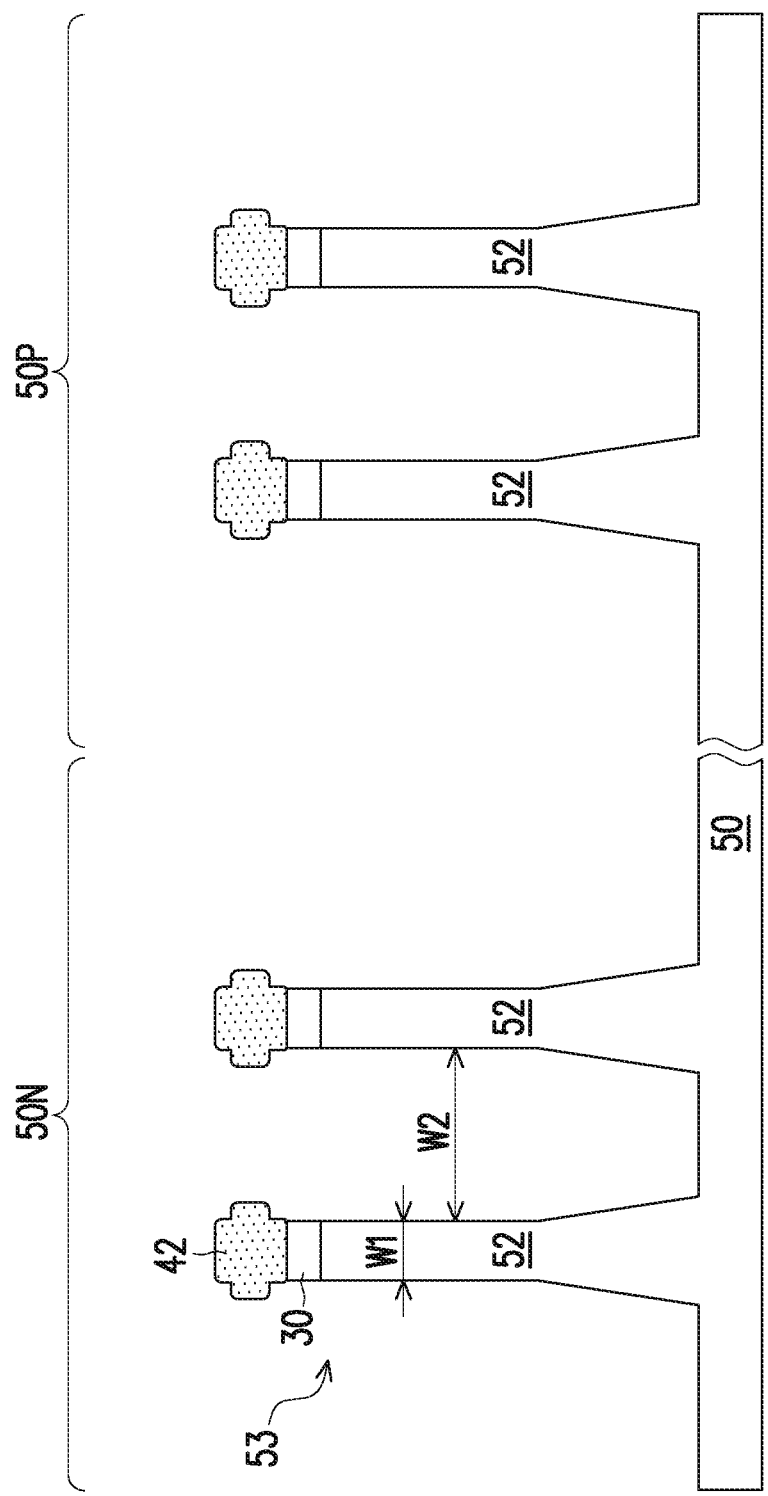
Figure 7B:
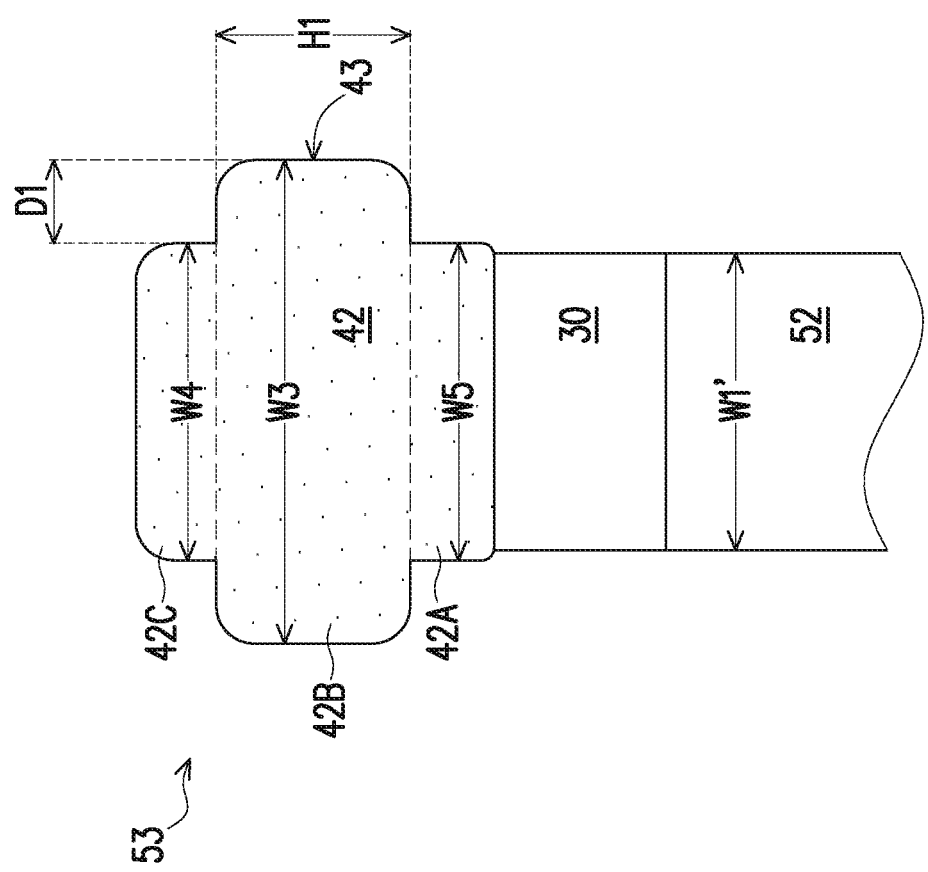

Turning to FIGS. 6A-6C, an etching process 48 is performed to transfer the pattern of the patterned second mask 44 to the first mask layer 32 to form patterned first mask 42 (see FIGS. 6C, 7A-B). The example patterned first mask 42 shown in FIGS. 6A-7 includes upper portions 42C, middle portions 42B below the upper portions 42C, and lower portions 42A below the middle portions 42B. The upper portions 42C, middle portions 42B, and lower portions 42A correspond to regions of the patterned first mask 42 having different sidewall characteristics, described below. The etching process 48 includes one or more etching steps that etch the patterned first mask 42 such that the middle portions 42B of the patterned first mask 42 have a greater width than the upper portions 42C or the lower portions 42A. For example, the patterned first mask 42 may have convex sidewalls or include lateral protrusions 43 as shown in FIGS. 6B-7. The etching process 48 described in the embodiment shown FIGS. 6A-C includes three etching steps 48A-C, though the etching process 48 may include more or fewer steps in other embodiments. The etching process 48 may be a single continuous etching process in some embodiments. The etching process 48 is an example technique to form the patterned first mask 42, and the patterned first mask 42 may be formed using other techniques in other embodiments.

Referring to FIG. 6A, a first etching step 48A is performed to remove portions of the first mask layer 32 using the patterned second mask 44 as an etching mask. The portion of the first mask layer 32 remaining after the first etching step 48A forms upper portions 42A. The first etching step 48A may be, for example, an anisotropic dry etching process such as an anisotropic plasma etching process, which may be performed in a process chamber. In some embodiments, the first etching step 48A includes generating a plasma with an RF power between about 100 Watts and about 1400 Watts. The first etching step 48A may be performed at a pressure between about 1 mTorr and about 100 mTorr and at a process temperature between about 25° C. and about 300° C. In some embodiments, the first etching step 48A may use one or more process gases such as $CF_4$, $CH_2F_2$, $CH_3F$, $CHF_3$, $SF_6$, $NF_3$, $Cl_2$, Ar, $O_2$, $N_2$, fluorides, chlorides, bromides, hydrides, the like, other types of process gases, or a combination. In some embodiments, a process gas or combination of process gases may be flowed into the process chamber at a flow rate between about 5 sccm and about 100 sccm. In some embodiments, the first etching step 48A includes generating a DC voltage bias between about 10 V and about 500 V. In some embodiments, the first etching step 48A may etch into the first mask layer 32 a depth between about 1 nm and about 50 nm.

Turning to FIG. 6B, a second etching step 48B is performed to further etch the first mask layer 32, forming middle portions 42B. The etching parameters of the second etching step 48B may be different than the etching parameters of the first etching step 48A, and the etching parameters of the second etching step 48B may be controlled such that the middle portions 42B have a width greater than that of the upper portions 42C. For example, the etching parameters of the second etching step 48B may be controlled or adjusted to form the protrusions 43. In some embodiments, the etching parameters of the second etching step 48B may be controlled to reduce the etch rate and/or anisotropy of the second etching step 48B relative to the first etching step 48A. For example, the RF power, DC voltage, process gas flow rate, process gas mixture, or other parameters may be adjusted. By lowering the etch rate and/or increasing the anisotropy of the etching, regions of the first mask layer 32 that are closer to sidewalls of the first mask layer 32 may be etched less than regions of the first mask layer 32 that are farther from sidewalls of the first mask layer 32. For example, regions of the first mask layer 32 between neighboring upper portions 42A may be etched at a greater rate than regions of the first mask layer 32 adjacent the upper portions 42A. In this manner, the middle portions 42B may be formed having protrusions 43.

In some embodiments, the second etching step 48B includes generating a plasma with an RF power between about 100 Watts and about 1400 Watts. The second etching step 48B may be performed at a pressure between about 1 mTorr and about 100 mTorr and at a process temperature between about 25° C. and about 300° C. In some embodiments, the second etching step 48B may use one or more process gases such as $CF_4$, $CH_2F_2$, $CH_3F$, $CHF_3$, $SF_6$, $NF_3$, $Cl_2$, Ar, $O_2$, $N_2$, fluorides, chlorides, bromides, hydrides, the like, other types of process gases, or a combination. In some embodiments, a process gas or combination of process gases may be flowed into the process chamber at a flow rate between about 5 sccm and about 100 sccm. In some embodiments, the second etching step 48B includes generating a DC voltage bias between about 10 V and about 500 V. In some embodiments, the second etching step 48B may etch into the first mask layer 32 a depth between about 1 nm and about 50 nm.

In some embodiments, one or more passivation layers (not shown in the figures) may be formed before or during the second etching step 48B in order to form the protrusions 43 or otherwise control the sidewall profile of the middle portions 42B. The passivation layer may cover surfaces of the first mask layer 32 during the second etching step 48B to reduce the etching at those surfaces. For example, a passivation layer may cover sidewall surfaces of the upper portions 42C or exposed surfaces of the middle portions 42B. The passivation layer may be a $C_xF_y$ polymer material or the like, and may be formed by a plasma process using a passivation process gas such as $CF_4$, $CH_2F_2$, $CH_3F$, $CHF_3$, the like, or a combination. In some embodiments, a passivation layer may be formed at the same time as the first mask layer 32 is being etched by flowing both etching and passivation process gases into the process chamber during the second etching step 48B. In some embodiments, a passivation layer may be formed in a separate passivation step during which the first mask layer 32 is etched. For example, a passivation layer may be formed in a passivation step during which the passivation process gas is flowed and the etching process gas is not flowed. In some embodiments, a cycle of alternating etching steps and passivation layer steps may be performed, in which surfaces of the first mask layer 32 are alternatingly etched and then protected by a passivation layer. In some embodiments, a passivation process gas or combination of gases may be flowed into the process chamber at a flow rate between about 5 sccm and about 100 sccm.

In some embodiments, before the second etching step 48B, a passivation layer may optionally be formed over surfaces of the first mask layer 32, including over sidewalls of the upper portions 45C. The passivation layer formed over the sidewalls of the upper portions 45C may protect regions of the first mask layer 32 that are near the upper portions 45C from being etched during the second etching step 48B. Additional passivation layers may be formed during the second etching step 48B to protect exposed sidewalls of the first mask layer 32. For example, a cycle of etching the first mask layer 32 and then forming a passivation layer on etched sidewalls of the first mask layer 32 may be performed to shape the sidewall profile of the first mask layer 32. In this manner, the characteristics of the passivation steps and etching steps may be controlled to form the protrusions 43. In some embodiments, the sidewalls of the upper portions 42C may be continuous (e.g., smooth or similarly sloped) with the sidewalls of the middle portions 42B.

Turning to FIG. 6C, a third etching step 48C is performed to further etch portions of the first mask layer 32, forming the patterned first mask 42. As shown in FIG. 6C, the third etching step 48C may also etch the ARC 30 and expose the substrate 50. The third etching step 48C may form lower portions 42A of the patterned first mask 42 having a smaller width than that of the middle portions 42B. In some embodiments, the etching parameters of the third etching step 48C are different than the etching parameters of the second etching step 48B. In some embodiments, the sidewalls of the lower portions 42A may be continuous (e.g., smooth or similarly sloped) with the sidewalls of the middle portions 42B. In some embodiments, the third etching step 48C includes generating a plasma with an RF power between about 10 Watts and about 1400 Watts. The third etching step 48C may be performed at a pressure between about 1 mTorr and about 100 mTorr and at a process temperature between about 25° C. and about 300° C. In some embodiments, the third etching step 48C may use one or more process gases such as $CF_4$, $CH_2F_2$, $CH_3F$, $CHF_3$, $SF_6$, $NF_3$, $Cl_2$, Ar, $O_2$, $N_2$, fluorides, chlorides, bromides, hydrides, the like, other types of process gases, or a combination. In some embodiments, a process gas or combination of process gases may be flowed into the process chamber at a flow rate between about 5 sccm and about 100 sccm. In some embodiments, the third etching step 48C includes generating a DC voltage bias between about 10 V and about 500 V.

In FIGS. 7A-B, fins 52 are formed in the substrate 50. FIG. 7B shows a close-up view of the top of a fin 52, including the patterned first mask 42 and ARC 30. The fins 52 are semiconductor strips. In some embodiments, the fins 52 may be formed in the substrate 50 by etching trenches in the substrate 50 using the patterned first mask 42 as an etching mask. Each fin 52 and its overlying layers (e.g., ARC 30, patterned first mask 42, etc.) forms a fin structure 53. The etching may be any acceptable etch process, such as a reactive ion etch (RIE), neutral beam etch (NBE), the like, or a combination thereof. The etch may be anisotropic. In some embodiments, the fins 52 may have a width W1 that is between about 5 nm and about 50 nm. Adjacent fins 52 may be separated by a width W2 that is between about 5 nm and about 50. In some embodiments, two or more adjacent fins 52 may be formed in a "crown" structure, in which lower portions of the adjacent fins 52 are merged.

As shown in FIG. 7B, the middle portions 42B of the patterned first mask 42 have a middle width W3 that is greater than a width W1' of the uppermost regions of the fins 52. In some embodiments, the middle width W3 is between about 7 nm and about 80 nm. The width W1' may be about the same as the width W1 (see FIG. 7A). The middle portions 42B of the patterned first mask 42 may include protrusions 43 that laterally extend beyond the uppermost regions of the fins 52, as shown in FIGS. 7A-B. The protrusions may have a height H1 between about 1 nm and about 50 nm. The ratio of H1 to the thickness of the first mask layer 32 may be between about 2:1 and about 20:1. In some cases, adhesion forces between adjacent fin structures 53 (e.g., Van der Waals forces, capillary forces, etc.) may cause the adjacent fin structures 53 to bend or collapse against each other. By forming a patterned first mask 42 that extends laterally beyond each fin 52, the contact area of each fin structure 53 is reduced, and the adhesion forces between adjacent fin structures 53 are also reduced. Thus, forming the patterned first mask 42 having a protruding shape can improve process yield by reducing the chance of the fin structures 53 collapsing.

Still referring to FIG. 7B, the upper portions 42C of the patterned first mask 42 may have an upper width W4 and the lower portions 42A of the patterned first mask 42 may have a lower width W5. The upper width W4 and/or the lower width W5 may be smaller than the middle width W3. In some embodiments, the upper width W4 is between about 5 nm and about 50 nm, and the lower width W5 is between about 5 nm and about 50 nm. In some embodiments, a ratio of W4:W3 is between about 1:1.2 and about 1:1.5. In some embodiments, a protrusion 43 of the middle portions 42B may laterally extend a distance D1 beyond a sidewall of the upper portions 42C or of the lower portions 42A. The distance D1 may be between about 2 nm and about 30 nm. In some cases, the chance of fin structure 53 collapse may be reduced more effectively by having the protrusions 43 extend a distance D1 that is at least 2 nm.

Figure 8:
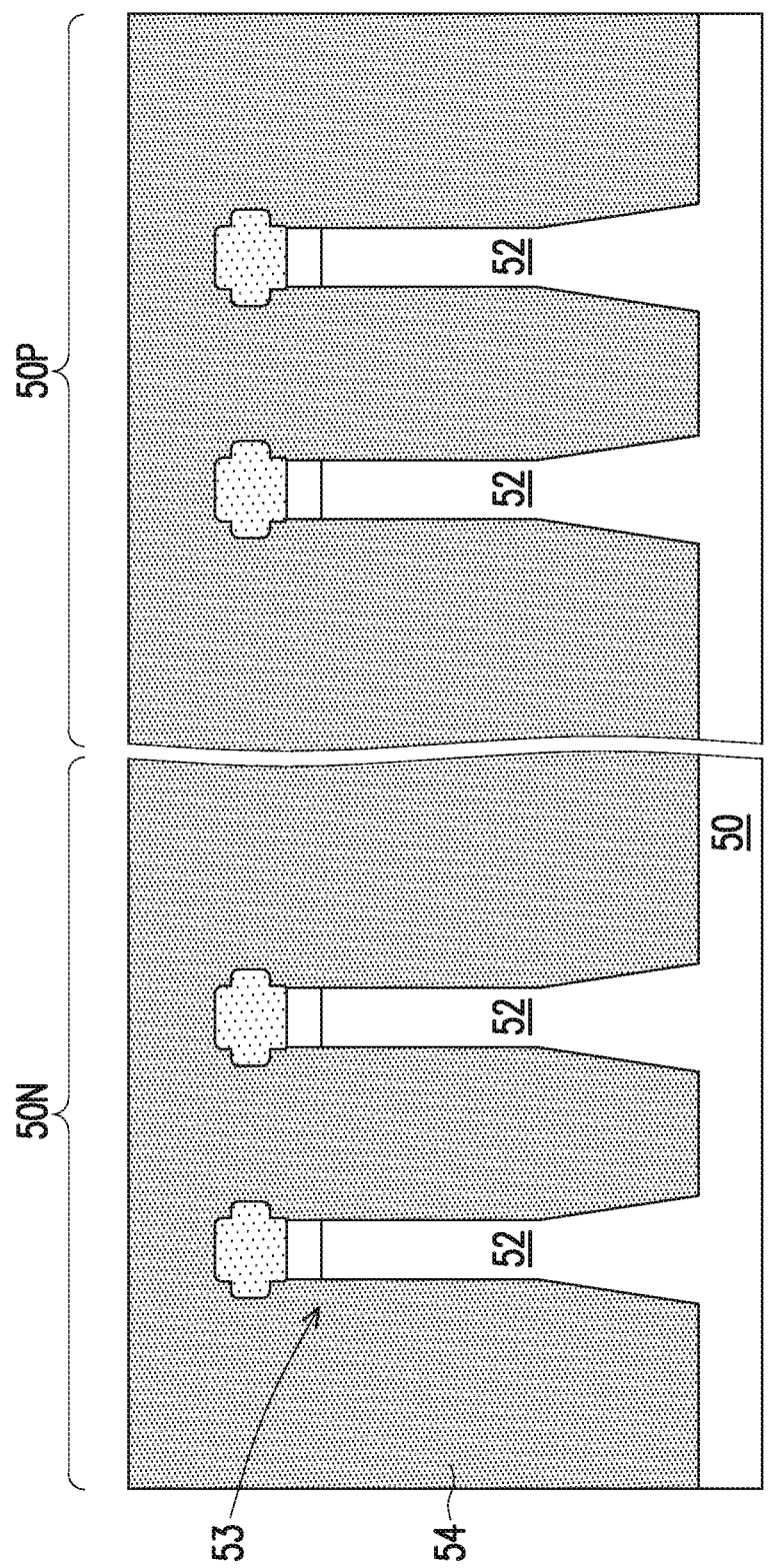

In FIG. 8, an insulation material 54 is formed over the substrate 50 and between neighboring fin structures 53. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fin structures 53. Although the insulation material 54 is illustrated as a single layer, some embodiments may utilize multiple layers. For example, in some embodiments a liner (not shown) may first be formed along a surface of the substrate 50 and the fin structures 53. Thereafter, a fill material, such as those discussed above may be formed over the liner.

Figure 9:
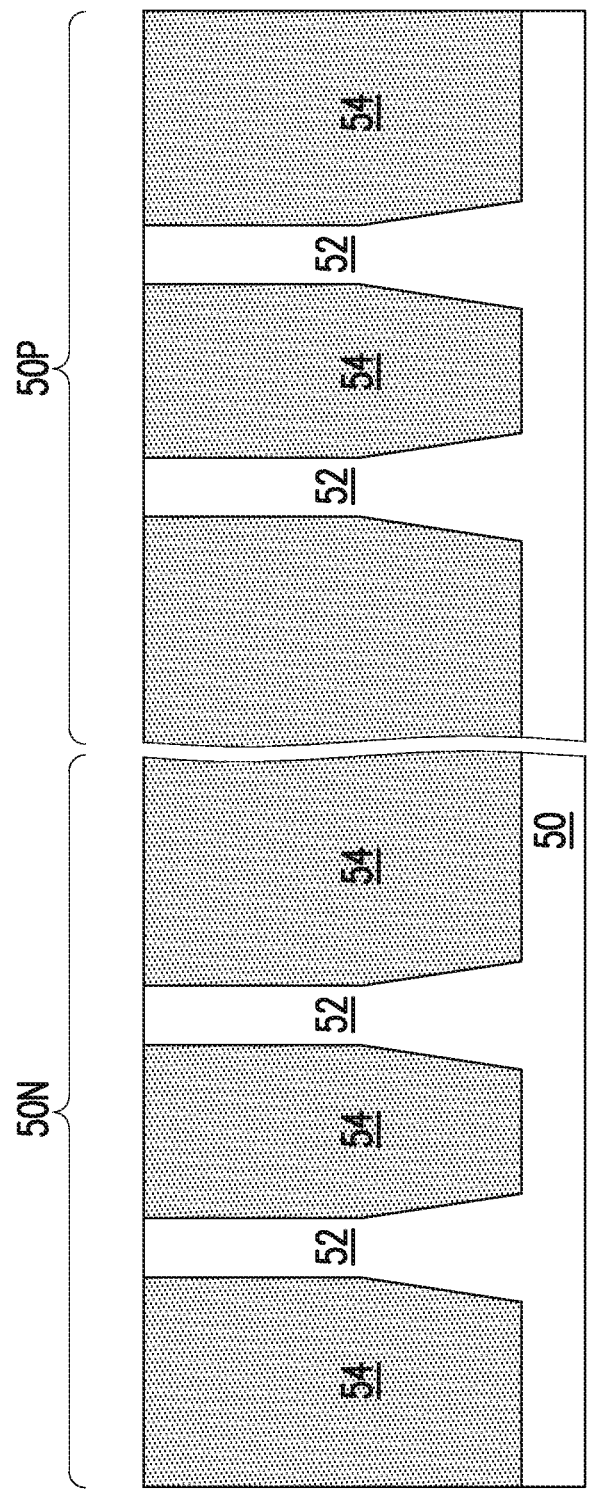

In FIG. 9, a removal process is applied to the insulation material 54 to remove excess insulation material 54 over the fins 52. The ARC 30 and patterned first mask 42 may also be removed. In some embodiments, a planarization process such as a chemical mechanical polish (CMP), an etch back process, combinations thereof, or the like may be utilized. The planarization process exposes the fins 52 such that top surfaces of the fins 52 and the insulation material 54 are level after the planarization process is complete.

Figure 10:
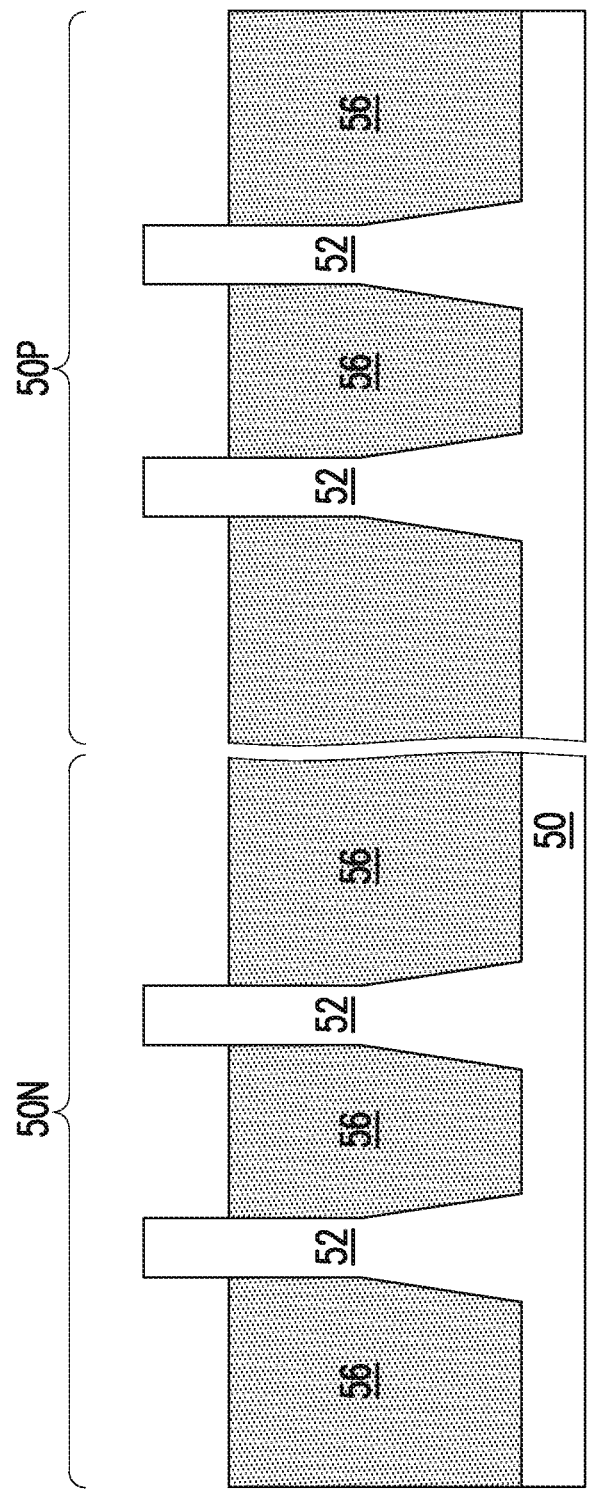

In FIG. 10, the insulation material 54 is recessed to form Shallow Trench Isolation (STI) regions 56. The insulation material 54 is recessed such that upper portions of fins 52 in the region 50N and in the region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, a chemical oxide removal with a suitable etch process using, for example, dilute hydrofluoric (dHF) acid may be used.

Further in FIG. 10, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ $cm^{-3}$, such as between about $10^{17}$ $cm^{-3}$ and about $10^{18}$ $cm^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, $BF_2$, indium, or the like implanted in the region to a concentration of equal to or less than $10^{18}$ $cm^{-3}$, such as between about $10^{17}$ $cm^{-3}$ and about $10^{18}$ $cm^{-3}$. After the implant, the photoresist may be removed, such as by an acceptable ashing process. After the implants of the region 50N and the region 50P, an anneal may be performed to activate the p-type and/or n-type impurities that were implanted.

Figure 11:
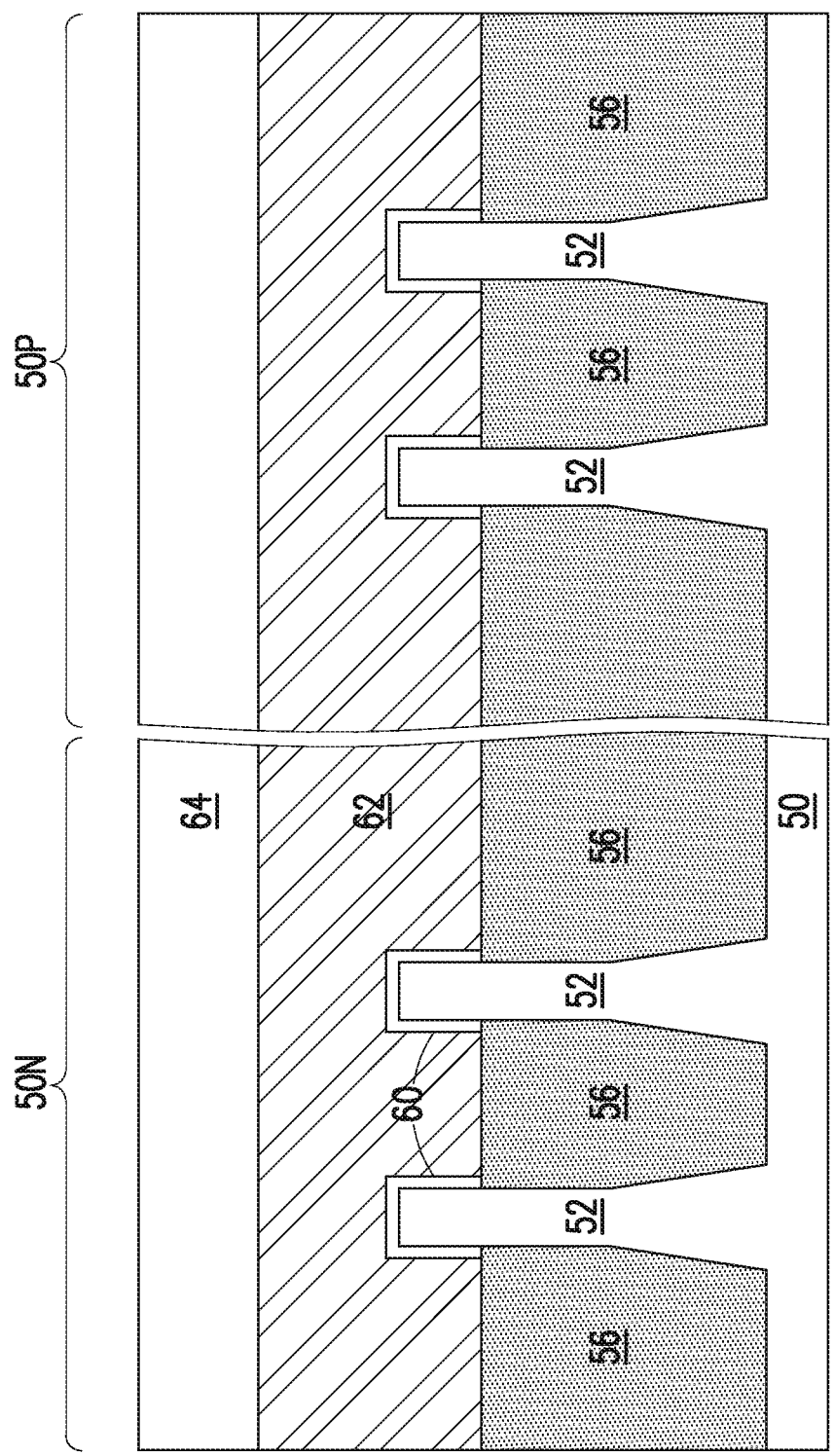

In FIG. 11, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity from the etching of isolation regions. The mask layer 64 may include, for example, SiN, SiON, or the like. In this example, a single dummy gate layer 62 and a single mask layer 64 are formed across the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

FIGS. 12A through 20B illustrate various additional steps in the manufacturing of embodiment devices. FIGS. 12A through 20B illustrate features in either of the region 50N and the region 50P. For example, the structures illustrated in FIGS. 12A through 20B may be applicable to both the region 50N and the region 50P. Differences (if any) in the structures of the region 50N and the region 50P are described in the text accompanying each figure.

In FIGS. 12A and 12B, the mask layer 64 (see FIG. 11) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 12A and 12B, gate seal spacers 80 can be formed on exposed surfaces of the dummy gates 72, the masks 74, and/or the fins 52. A thermal oxidation or a deposition followed by an anisotropic etch may form the gate seal spacers 80.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type impurities (e.g., n-type) may be implanted into the exposed fins 52 in the region 50N. The mask may then be removed. The n-type impurities may be any of the n-type impurities previously discussed, and the p-type impurities may be any of the p-type impurities previously discussed. The lightly doped source/drain regions may have a concentration of impurities of from about $10^{15}$ $cm^{-3}$ to about $10^{16}$ $cm^{-3}$. An anneal may be used to activate the implanted impurities.

Figure 13B:
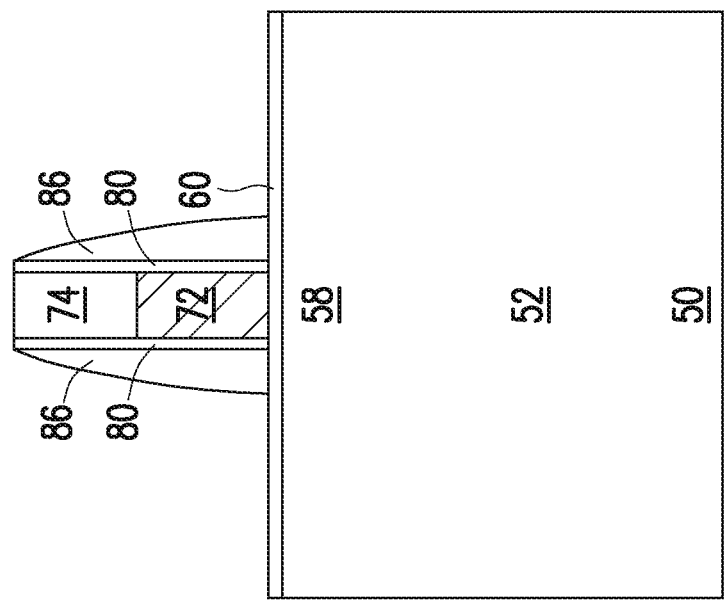
Figure 13A:
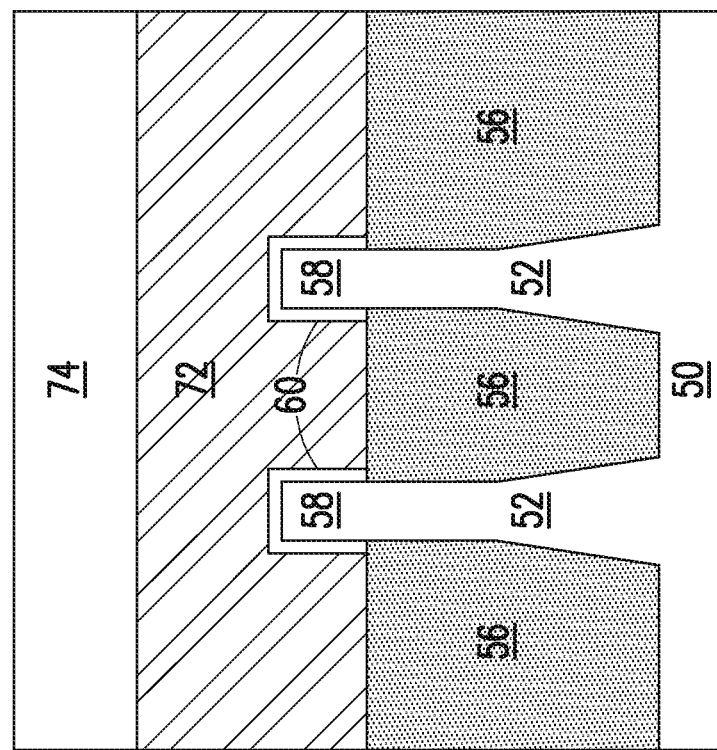
Figure 14D:
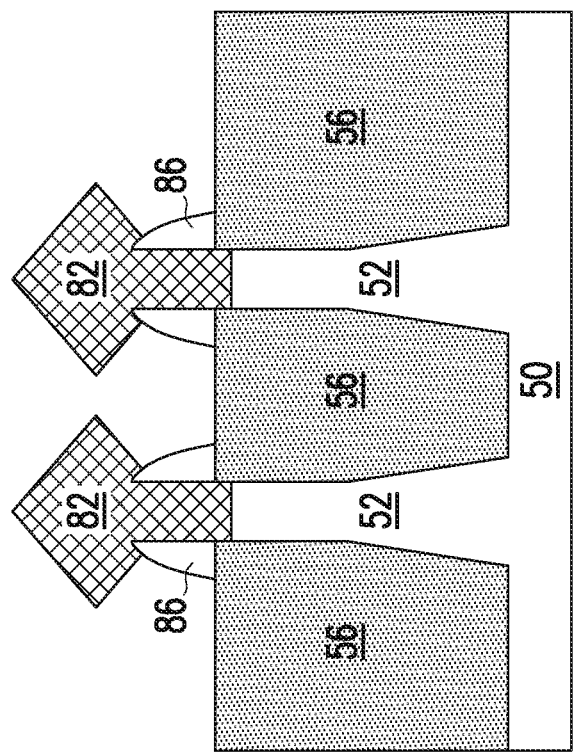
Figure 14C:
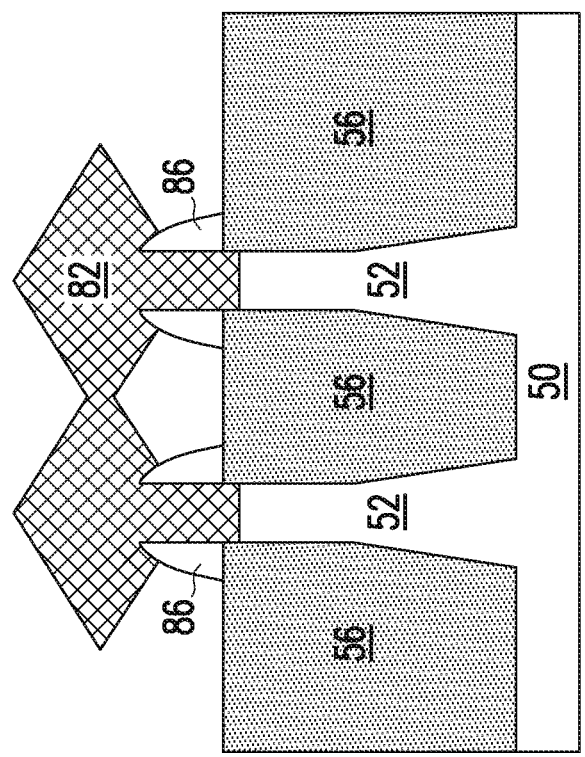

In FIGS. 13A and 13B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon nitride, SiCN, a combination thereof, or the like.

In FIGS. 14A and 14B epitaxial source/drain regions 82 are formed in the fins 52 to exert stress in the respective channel regions 58, thereby improving performance. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs.

The epitaxial source/drain regions 82 in the region 50N, e.g., the NMOS region, may be formed by masking the region 50P, e.g., the PMOS region, and etching source/drain regions of the fins 52 in the region 50N to form recesses in the fins 52. Then, the epitaxial source/drain regions 82 in the region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the region 50N may include materials exerting a tensile strain in the channel region 58, such as silicon, SiC, SiCP, SiP, or the like. The epitaxial source/drain regions 82 in the region 50N may have surfaces raised from respective surfaces of the fins 52 and may have facets.

The epitaxial source/drain regions 82 in the region 50P, e.g., the PMOS region, may be formed by masking the region 50N, e.g., the NMOS region, and etching source/drain regions of the fins 52 in the region 50P are etched to form recesses in the fins 52. Then, the epitaxial source/drain regions 82 in the region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the region 50P may comprise materials exerting a compressive strain in the channel region 58, such as SiGe, SiGeB, Ge, GeSn, or the like. The epitaxial source/drain regions 82 in the region 50P may also have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the region 50N and the region 50P, upper surfaces of the epitaxial source/drain regions have facets which expand laterally outward beyond sidewalls of the fins 52. In some embodiments, these facets cause adjacent source/drain regions 82 of a same FinFET to merge as illustrated by FIG. 14C. In other embodiments, adjacent source/drain regions 82 remain separated after the epitaxy process is completed as illustrated by FIG. 14D.

Figure 15B:
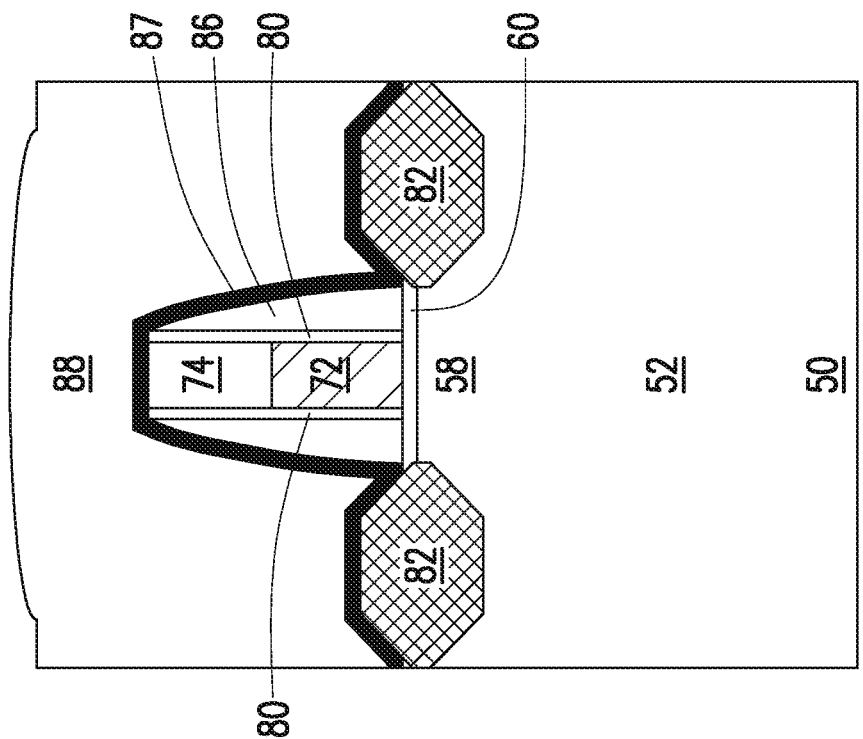
Figure 15A:
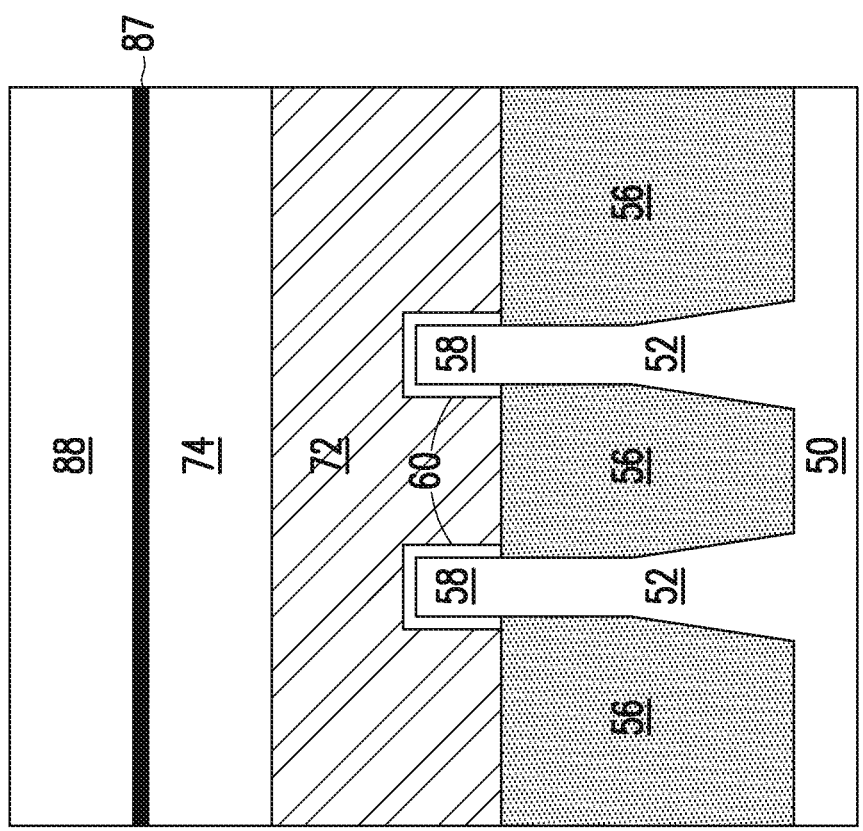

In FIGS. 15A and 15B, a first ILD 88 is deposited over the structure illustrated in FIGS. 14A and 14B. The first ILD 88 may be formed of a dielectric material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a different etch rate than the material of the overlying first ILD 88.

Figure 16A:
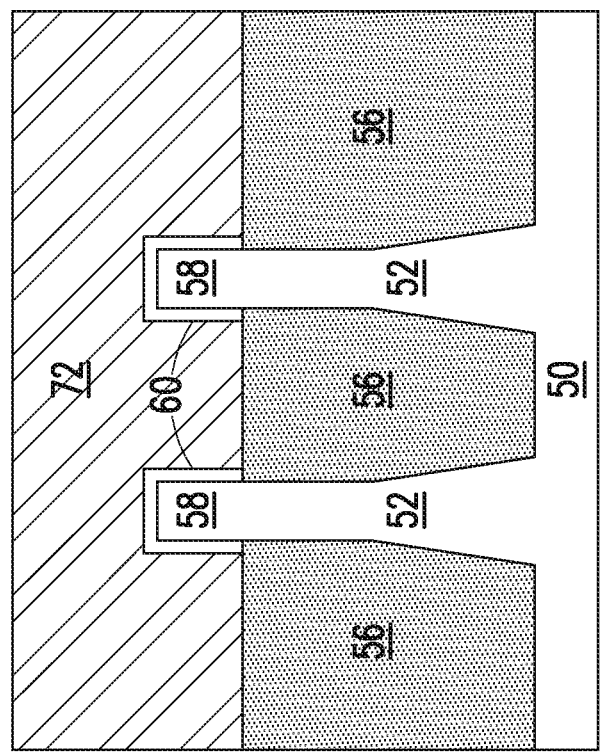
Figure 16B:
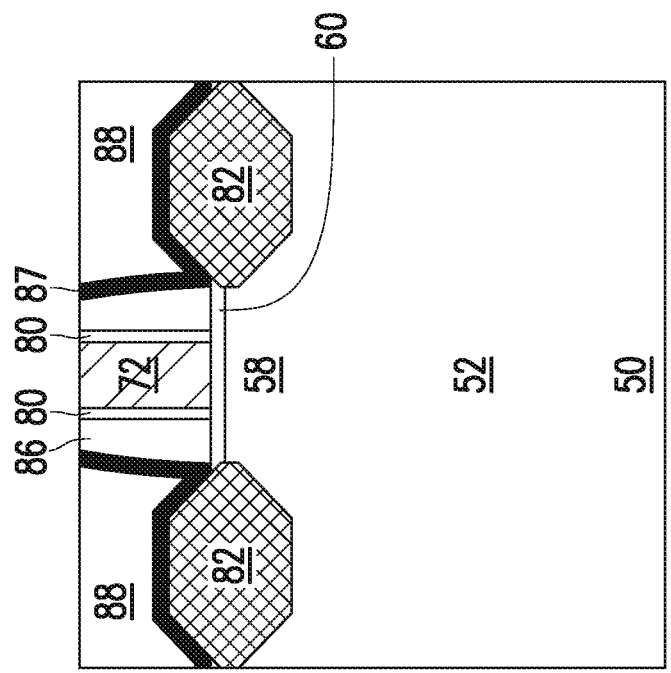

In FIGS. 16A and 16B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the top surface of the masks 74.

Figure 17B:
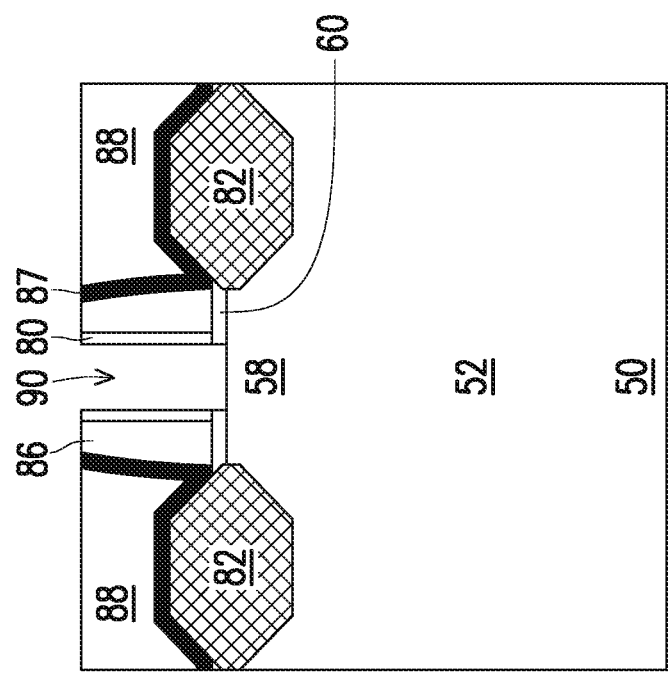
Figure 17A:
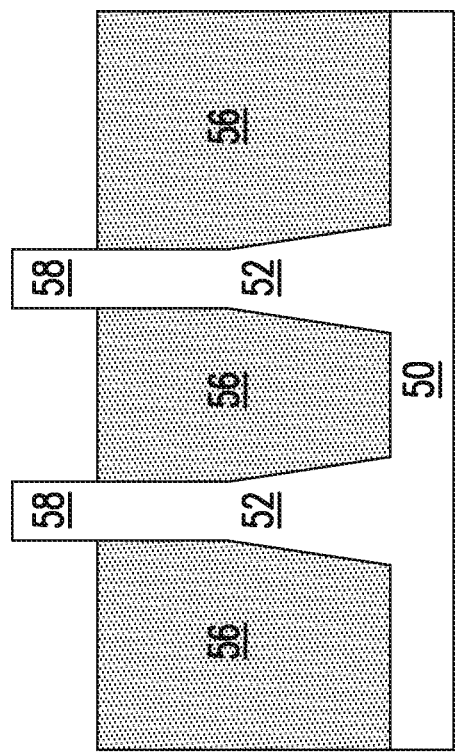

In FIGS. 17A and 17B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first ILD 88 or the gate spacers 86. Each recess 90 exposes a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 18C:
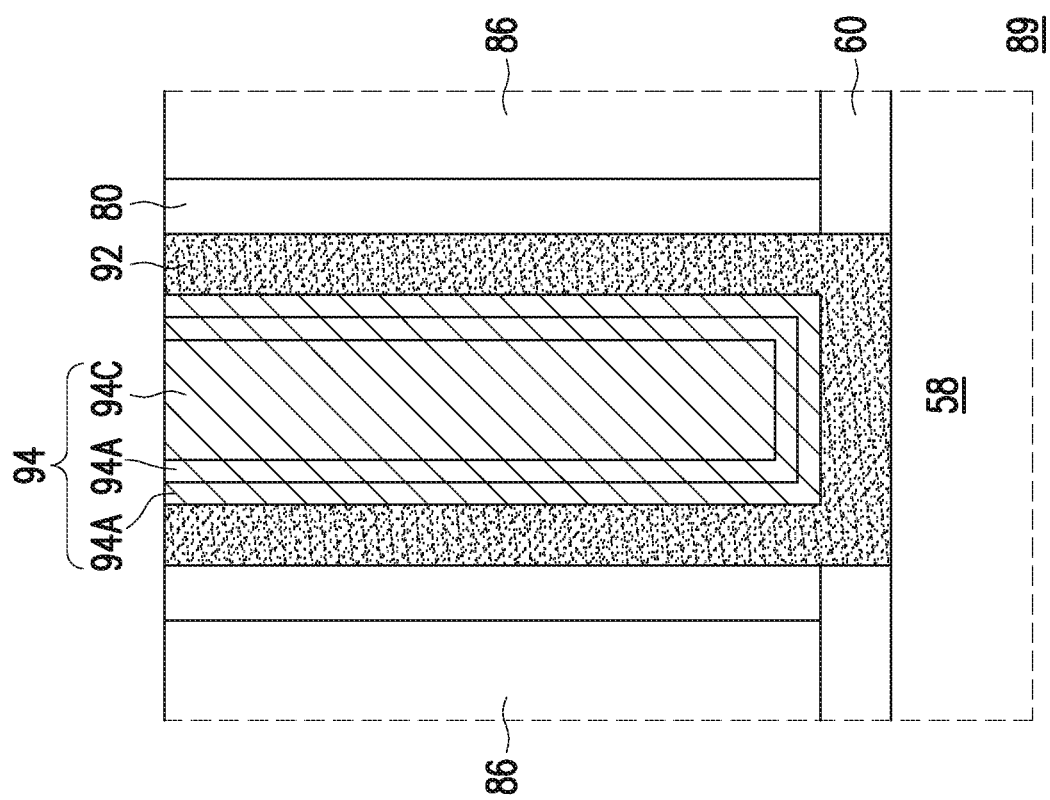

In FIGS. 18A and 18B, gate dielectric layers 92 and gate electrodes 94 are formed for replacement gates. FIG. 18C illustrates a detailed view of region 89 of FIG. 14B. Gate dielectric layers 92 are deposited conformally in the recesses 90, such as on the top surfaces and the sidewalls of the fins 52 and on sidewalls of the gate seal spacers 80/gate spacers 86. The gate dielectric layers 92 may also be formed on top surface of the first ILD 88. In accordance with some embodiments, the gate dielectric layers 92 comprise silicon oxide, silicon nitride, or multilayers thereof. In some embodiments, the gate dielectric layers 92 include a high-k dielectric material, and in these embodiments, the gate dielectric layers 92 may have a k value greater than about 7.0, and may include a metal oxide or a silicate of Hf, Al, Zr, La, Mg, Ba, Ti, Pb, and combinations thereof. The formation methods of the gate dielectric layers 92 may include Molecular-Beam Deposition (MBD), ALD, PECVD, and the like. In embodiments where portions of the dummy dielectric layer 60 remains in the recesses 90, the gate dielectric layers 92 include a material of the dummy dielectric layer 60 (e.g., silicon oxide).

The gate electrodes 94 are deposited over the gate dielectric layers 92, respectively, and fill the remaining portions of the recesses 90. The gate electrodes 94 may include a metal-containing material such as TiN, TiO, TaN, TaC, Co, Ru, Al, W, combinations thereof, or multi-layers thereof. For example, although a single layer gate electrode 94 is illustrated in FIG. 18B, the gate electrode 94 may comprise any number of liner layers 94A, any number of work function tuning layers 94B, and a fill material 94C as illustrated by FIG. 18C. After the filling of the gate electrodes 94, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the region 50N and the region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 19B:
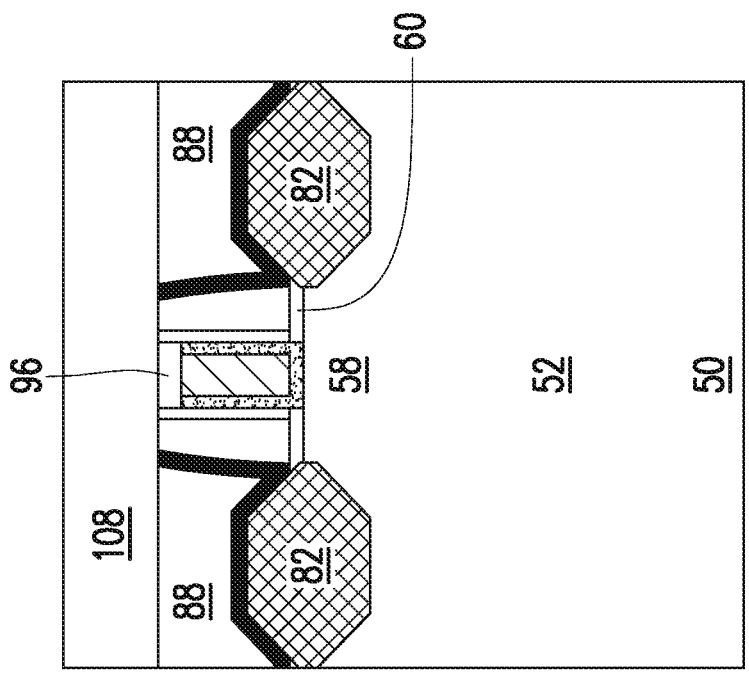
Figure 19A:
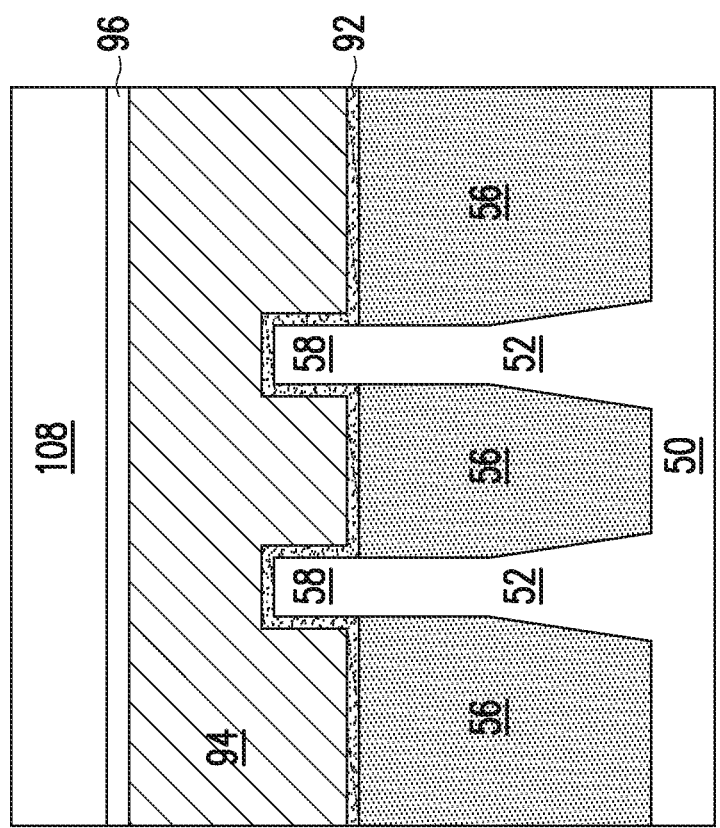

In FIGS. 19A and 19B, a second ILD 108 is deposited over the first ILD 88. In some embodiment, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. In accordance with some embodiments, before the formation of the second ILD 108, the gate stack (including a gate dielectric layer 92 and a corresponding overlying gate electrode 94) is recessed, so that a recess is formed directly over the gate stack and between opposing portions of gate spacers 86, as illustrated in FIGS. 19A and 19B. A gate mask 96 comprising one or more layers of dielectric material, such as silicon nitride, silicon oxynitride, or the like, is filled in the recess, followed by a planarization process to remove excess portions of the dielectric material extending over the first ILD 88. The subsequently formed gate contacts 110 (FIGS. 20A and 20B) penetrate through the gate mask 96 to contact the top surface of the recessed gate electrode 94.

Figure 20B:
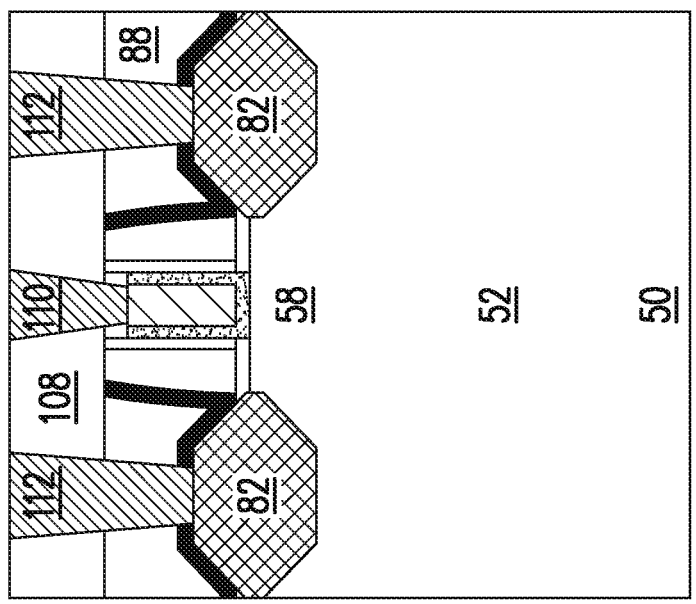
Figure 20A:
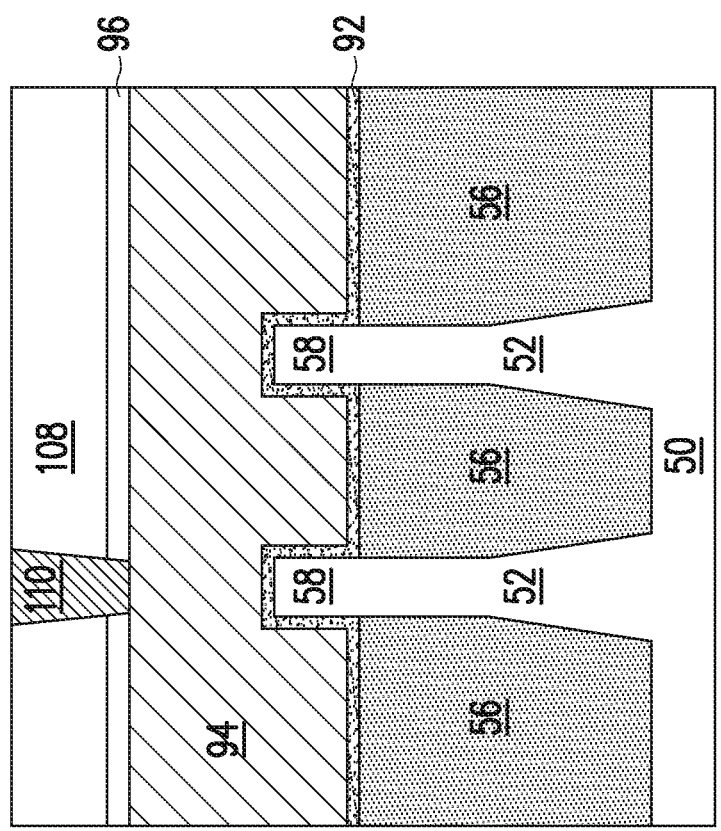

In FIGS. 20A and 20B, gate contacts 110 and source/drain contacts 112 are formed through the second ILD 108 and the first ILD 88 in accordance with some embodiments. Openings for the source/drain contacts 112 are formed through the first and second ILDs 88 and 108, and openings for the gate contact 110 are formed through the second ILD 108 and the gate mask 96. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 108. The remaining liner and conductive material form the source/drain contacts 112 and gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 106. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

Figure 26:
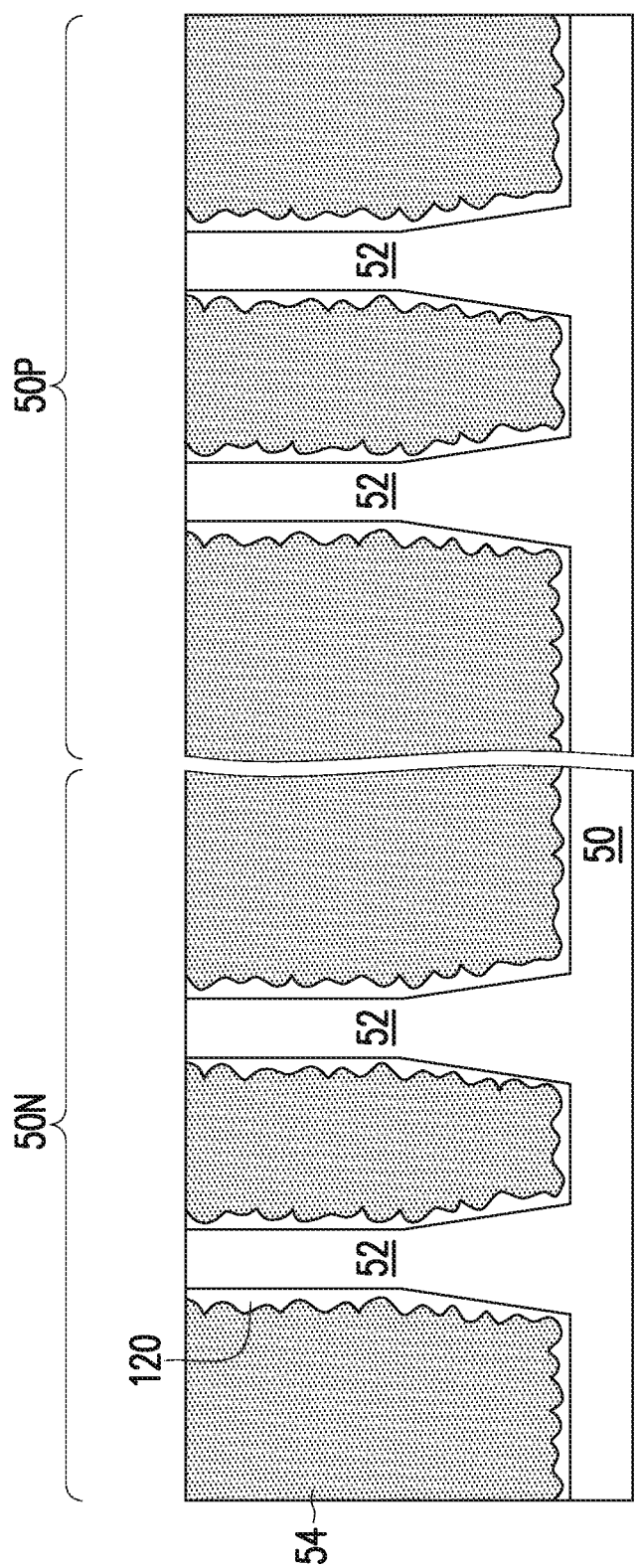
Figure 27:
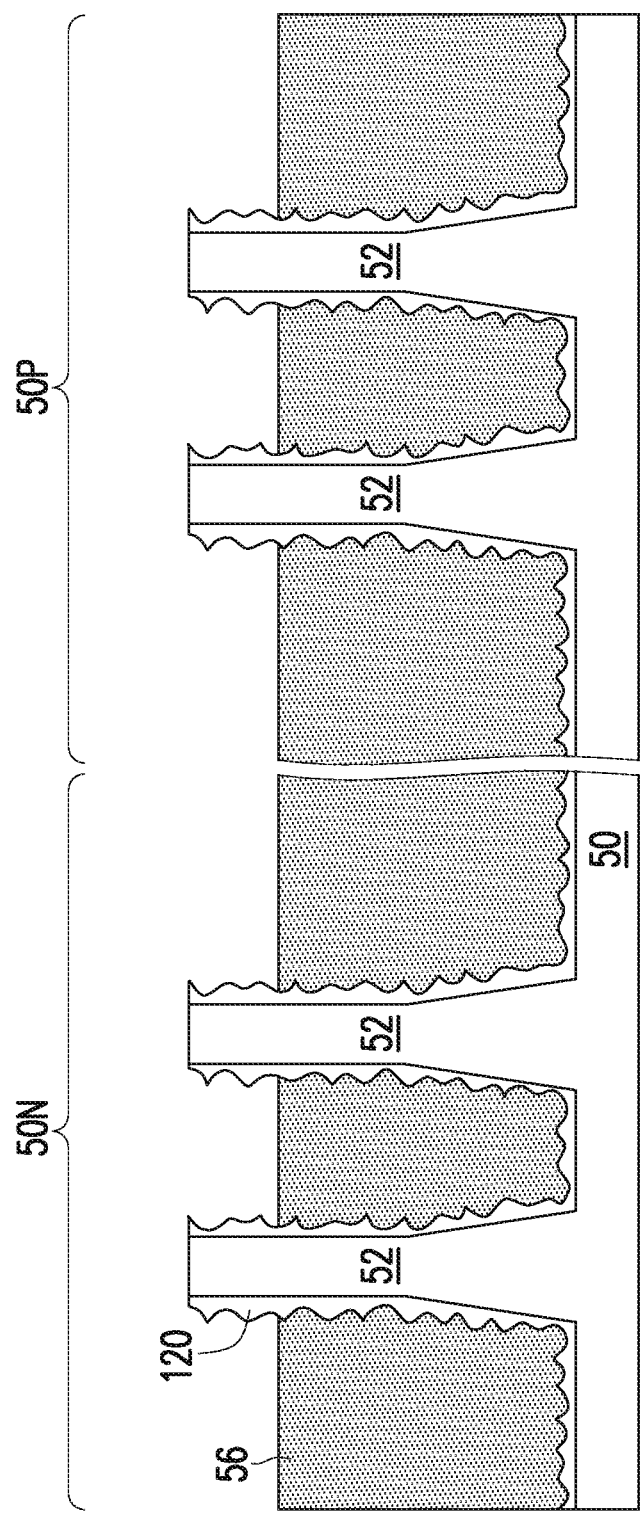
Figure 28B:
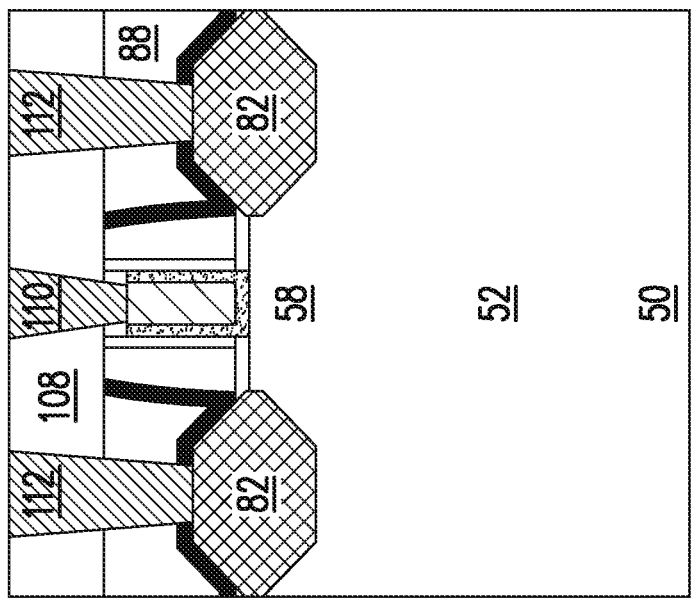

FIGS. 21 through 28B are cross-sectional views of intermediate stages in the manufacturing of FinFETs that includes a roughening film 120 over the fins 52, in accordance with some embodiments. FIGS. 21-27 and 28A are illustrated along reference cross-section A-A illustrated in FIG. 1, and FIG. 28B is illustrated along a similar cross-section B-B illustrated in FIG. 1.

Figure 21:
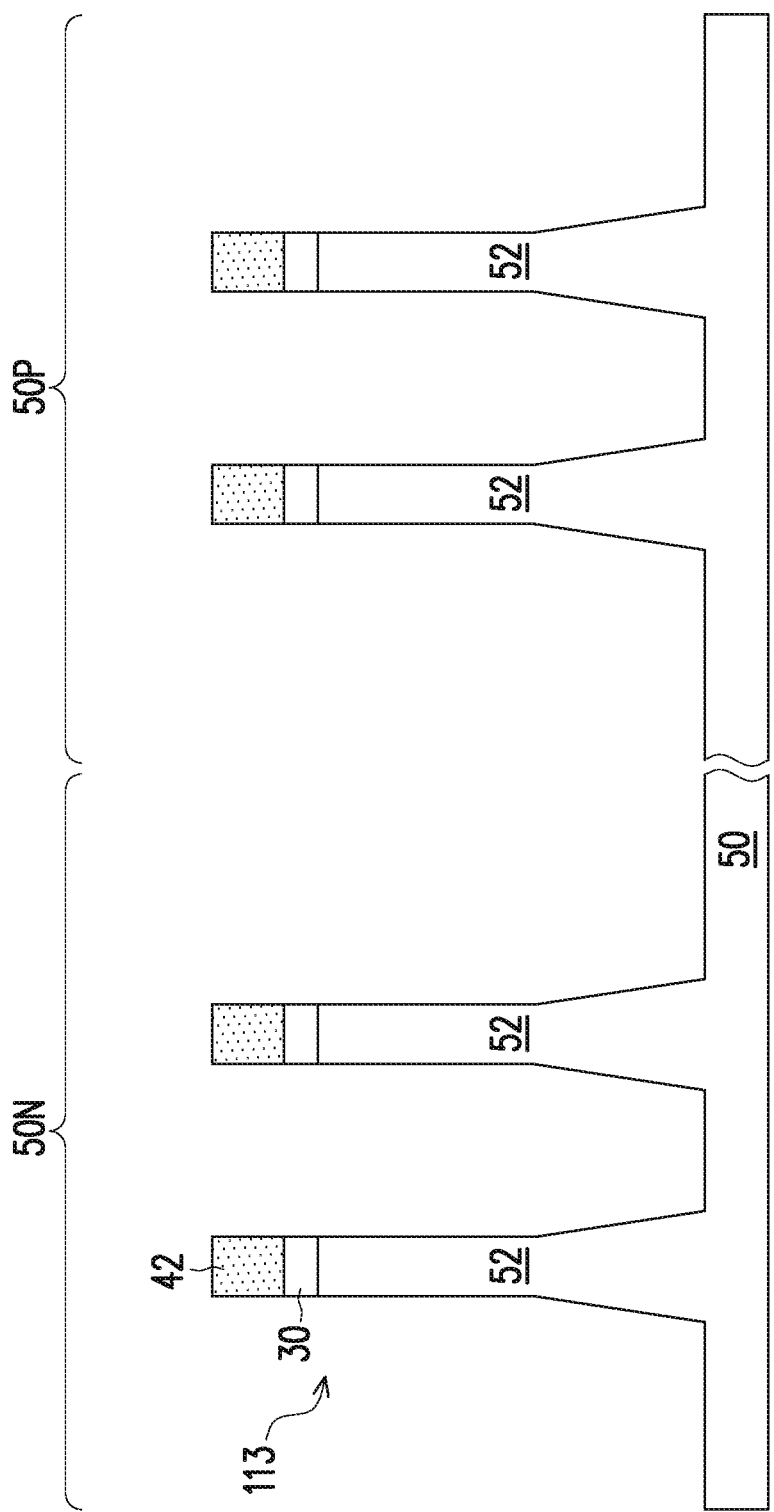
FIGS. 21-28B are cross-sectional views of intermediate stages in the manufacturing of FinFETs, in accordance with some embodiments.
Figure 22:
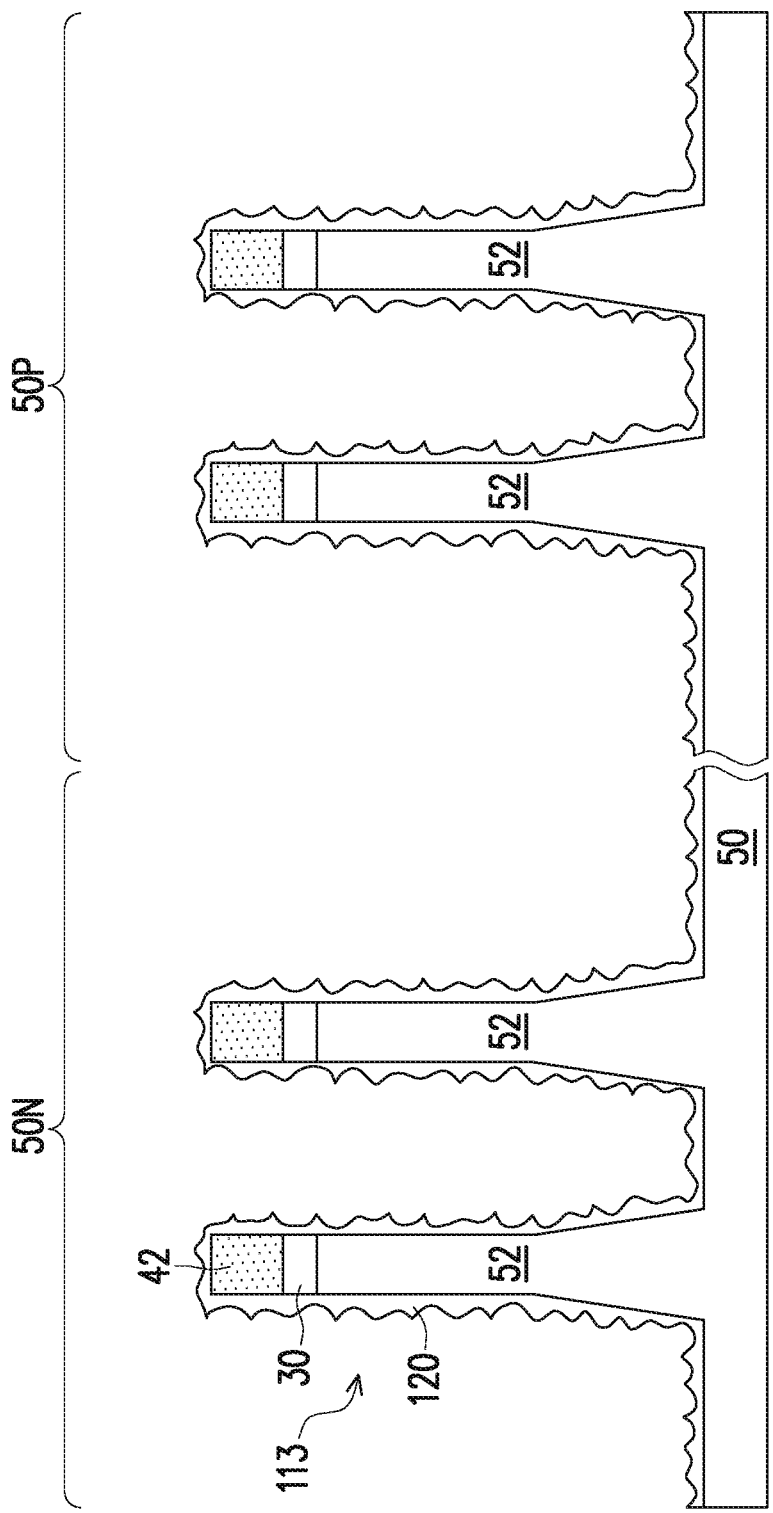

FIG. 21 illustrates fin structures 113, according to an embodiment. The fin structures 113 include a patterned first mask 42 and an ARC 30 formed over fins 52. The fin structures 113 may be similar to the fin structures 53 shown in FIG. 7A and may be formed in a similar manner. For example, a patterned first mask 42 may be used as an etching mask to etch the substrate 50, similar to the process shown in FIGS. 2-7A. In some embodiments, the patterned first mask 42 may have straight sidewalls, as shown in FIGS. 21-22. In other embodiments, the patterned first mask 42 may have protrusions 43, similar to those described previously with respect to the patterned first mask 42 of the fin structures 53 shown in FIGS. 7A-B.

Figure 23:
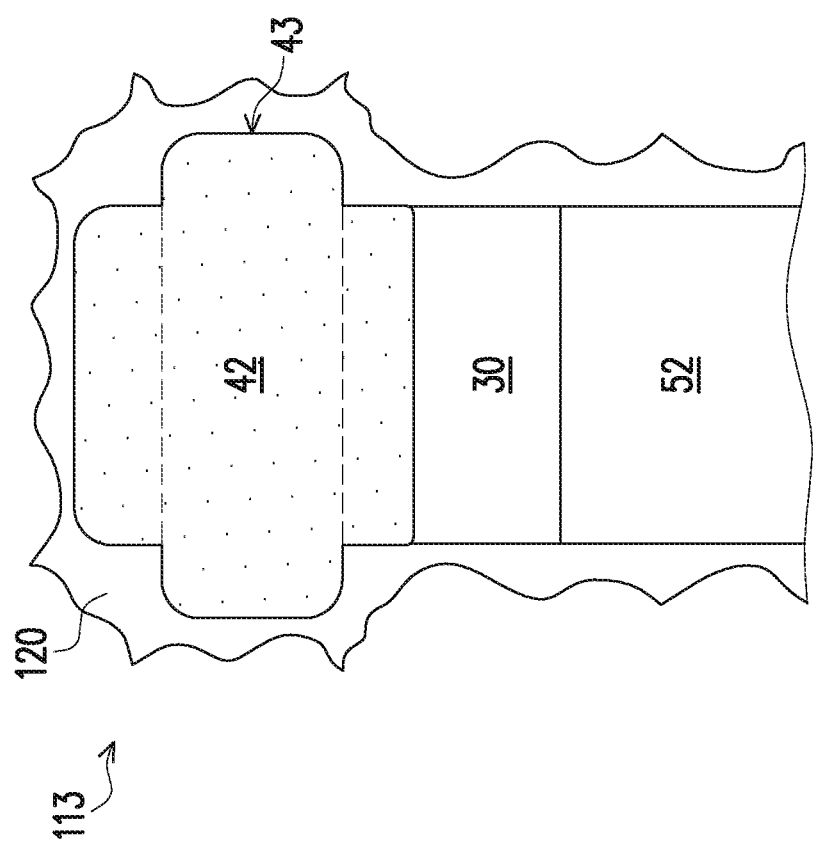

In FIG. 22, a roughening film 120 is deposited over surfaces of the fin structures 113. The roughening film 120 may also be deposited over surfaces of the substrate 50. The surface of the roughening film 120 is rougher than the surfaces of the fin structures 113 and provides less contact area than the fin structures 113. Thus, due to the presence of the roughening film 120 on the fin structures 113, the chance is reduced of the fin structures 113 collapsing due to adhesion forces. In some embodiments, the patterned first mask 42 may be formed having protrusions 43 (see FIGS. 7A-B) in addition to the use of the roughening film 120, which may further reduce the chance of the fin structures 113 collapsing. As an illustrative example, FIG. 23 shows a close-up view of an embodiment fin structure 113 having both a roughening film 120 and protrusions 43 in the patterned first mask 42.

In some embodiments, the roughening film 120 may be one or more layers of materials such as silicon, polysilicon, silicon oxide, silicon nitride, another dielectric material, a combination, or the like. The roughening film 120 may be formed using a suitable deposition process, such as CVD, ALD, PVD, sputtering, the like, or a combination. In some embodiments, the roughening film 120 may be polysilicon. The polysilicon may be formed using process gases such as silane or other suitable process gases. In some embodiments, the polysilicon may be formed using process gases that are flowed into a process chamber at a flow rate between about 5 sccm and about 100 sccm. In some embodiments, the polysilicon may be formed using a process pressure between about 1 mTorr and about 100 mTorr. In some embodiments, the polysilicon may be formed using a process temperature between about 500° C. and about 900° C.

In some embodiments, the process conditions of the formation of the roughening film 120 may be controlled to control the roughness of the roughening film 120. For example, in some embodiments in which the roughening film 120 includes polysilicon, the roughness of the roughening film 120 may be controlled by controlling the thickness and/or the average grain size of the polysilicon. In some cases, a polysilicon layer having a greater average thickness and/or larger average grain size has a rougher surface than a thinner polysilicon layer or a polysilicon layer having a smaller average grain size. In some embodiments, the roughening film 120 may include a layer of polysilicon that has an average thickness (e.g., T1 shown in FIG. 23) between about 5 nm and about 50 nm. In some embodiments, the roughening film 120 may include a layer of polysilicon that has an average grain size between about 0.5 nm and about 20 nm. In some embodiments, by forming the polysilicon using a lower process temperature, the average grain size of the polysilicon may be increased. In some embodiments, the roughening film 120 may include a layer of polysilicon formed using a process temperature that is between 500° C. and about 900° C. in order to increase the average grain size of the polysilicon.

Figure 24:
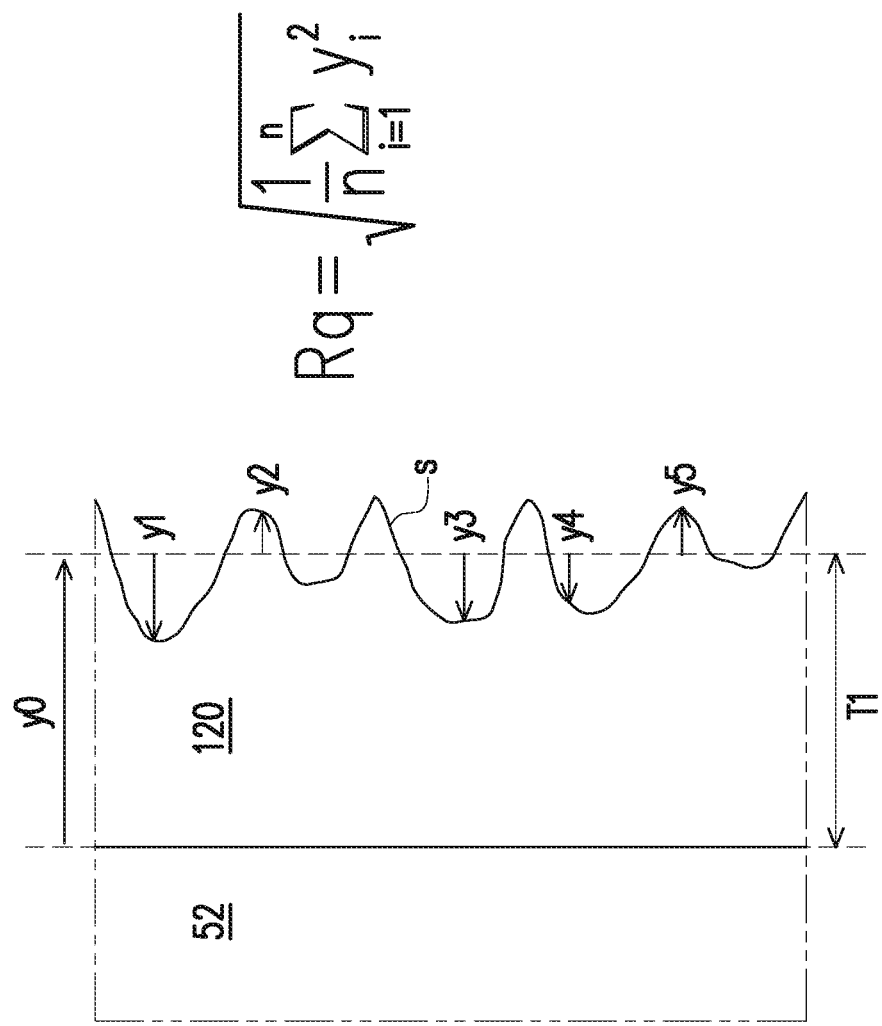

Turning to FIG. 24, a close-up view of a portion of the roughening film 120 over a sidewall of a fin 52 is shown. The roughening film 120 has an average thickness T1 that corresponds to an average distance $y_0$ from the underlying feature over which the roughening film 120 is formed (e.g., from the fin 52). The roughness Rq of the roughening film 120 may be characterized by the root mean square (RMS) of the distance between the average distance $y_0$ and points $y_1$ on the surface of the roughening film 120, measured in a direction parallel to the average distance $y_0$. An expression for the roughness Rq using n points on the surface of the roughening film 120 is shown in FIG. 23, and example points $y_1$-$y_5$ on the surface of the roughening film 120 are also shown. The roughness Rq may be determined using more or fewer points than the number shown in FIG. 23. In some embodiments, the roughness Rq of the roughening film 120 may be between about 0.5 nm and about 20 nm. In some cases, the chance of fin structure 53 collapse may be reduced more effectively by having a roughening film 120 with a roughness Rq that is at least 0.5 nm.

Figure 25:
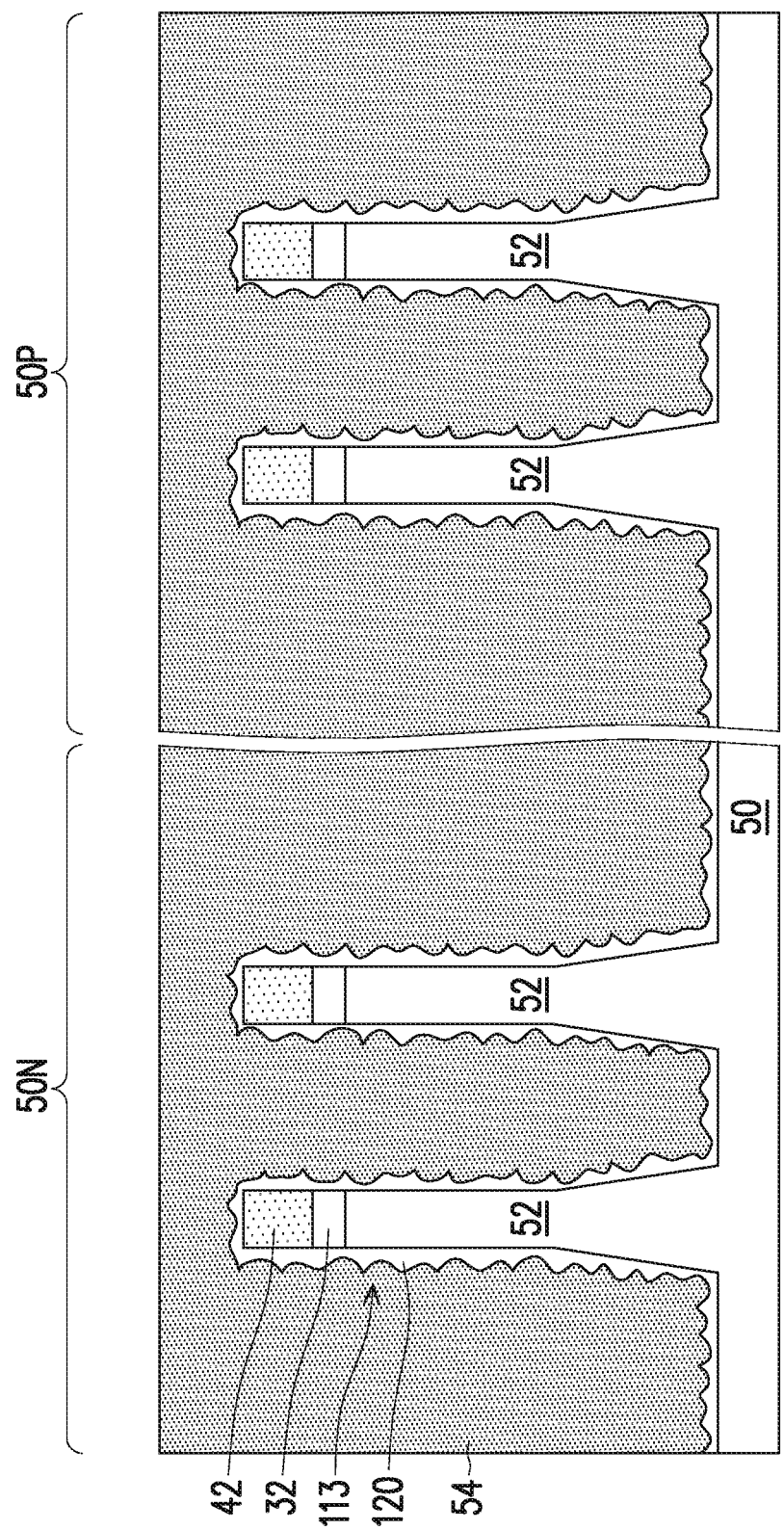

FIGS. 25 through 28B illustrate subsequent intermediate stages in the manufacturing of FinFETs following FIG. 22, in accordance with some embodiments. The processing steps shown in FIGS. 25 through 28B may be similar to steps shown above in FIGS. 8 through 20B. In FIG. 25, an insulation material 54 is formed over the roughening film 120, including over the substrate 50 and between neighboring fin structures 113. The insulation material 54 may be similar to the insulation material 54 described previously in FIG. 8. For example, the insulation material 54 may be an oxide, such as silicon oxide, a nitride, the like, or a combination thereof, and may be formed by HDP-CVD, CVD, FCVD, the like, or a combination thereof. Other insulation materials formed by any acceptable process may be used. In an embodiment, the insulation material 54 is formed such that excess insulation material 54 covers the fin structures 113. Although the insulation material 54 is illustrated as a single layer, some embodiments may utilize multiple layers.

In FIG. 26, a removal process is applied to the insulation material 54 to remove excess insulation material 54 over the fins 52. The ARC 30, patterned first mask 42, and portions of the roughening film 120 may also be removed. In some embodiments, a CMP, an etch back process, combinations thereof, or the like may be utilized. The planarization process exposes the fins 52 such that top surfaces of the fins 52, surfaces of the roughening film 120, and surfaces of the insulation material 54 are level after the planarization process is complete.

In FIG. 27, the insulation material 54 is recessed to form STI regions 56. The insulation material 54 is recessed such that upper portions of fins 52 in the region 50N and in the region 50P protrude from between neighboring STI regions 56. The STI regions 56 may be similar to those described previously in FIG. 10. The STI regions 56 may be recessed using an acceptable etching process, such as one that is selective to the material of the insulation material 54 (e.g., etches the material of the insulation material 54 at a faster rate than the material of the fins 52 or the roughening film 120). For example, a chemical oxide removal with a suitable etch process using, for example, dilute hydrofluoric (dHF) acid may be used. Further in FIG. 27, appropriate wells (not shown) may be formed in the fins 52 and/or the substrate 50, which may be similar to those described previously with respect to FIG. 10. In some embodiments, a P well may be formed in the region 50N, and an N well may be formed in the region 50P. In some embodiments, a P well or an N well are formed in both the region 50N and the region 50P.

Figure 28A:
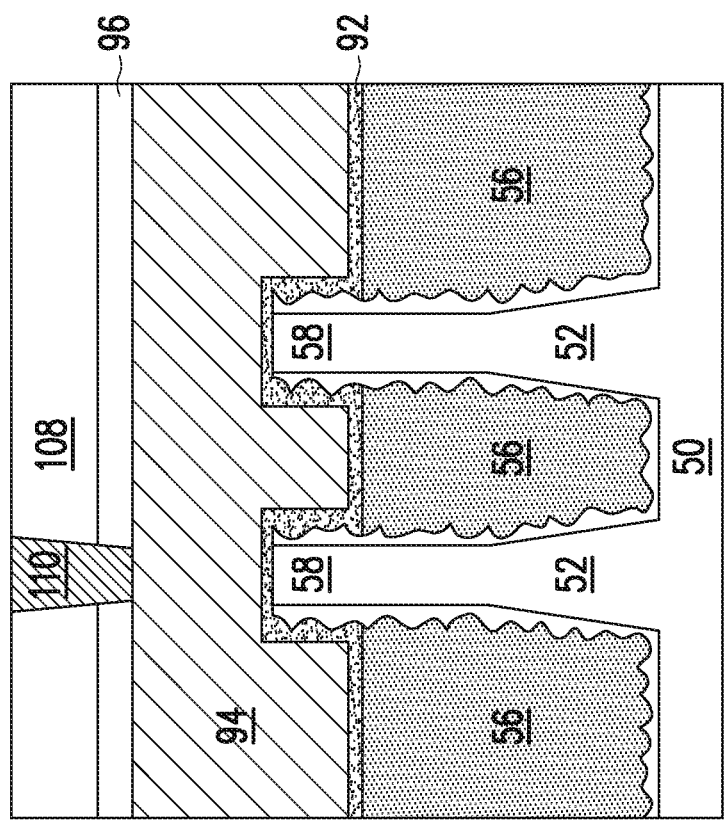

FIGS. 28A-B illustrate cross-sectional views of FinFETs, in accordance with some embodiments. FIGS. 28A-B illustrate features in either of the region 50N and the region 50P. The FinFETs shown in FIGS. 28A-B may be formed subsequent to the structure shown in FIG. 27. In some embodiments, the FinFETs shown in FIGS. 28A-B may be formed having features and using process steps similar to those described above with respect to FIGS. 11 through 20B. For example, a dummy gate structure and gate spacers may be formed over the fins 52, and epitaxial source/drain regions 82 may be formed in the fins 52. A first ILD 88 may be formed over the fins 52 and epitaxial source/drain regions 82, and the dummy gate structure may be replaced by a gate stack including gate electrodes 94 and gate dielectric layers 92. A second ILD 108 may be formed over the first ILD 88, and then gate contacts 110 and source/drain contacts 112 may be formed through the second ILD 108 and the first ILD 88.

FIGS. 29 through 35B are cross-sectional views of intermediate stages in the manufacturing of FinFETs that includes a roughening etch 140 that roughens the fins 52, in accordance with some embodiments. FIGS. 29-35 and 36A are illustrated along reference cross-section A-A illustrated in FIG. 1, and FIG. 36B is illustrated along a similar cross-section B-B illustrated in FIG. 1.

Figure 29:
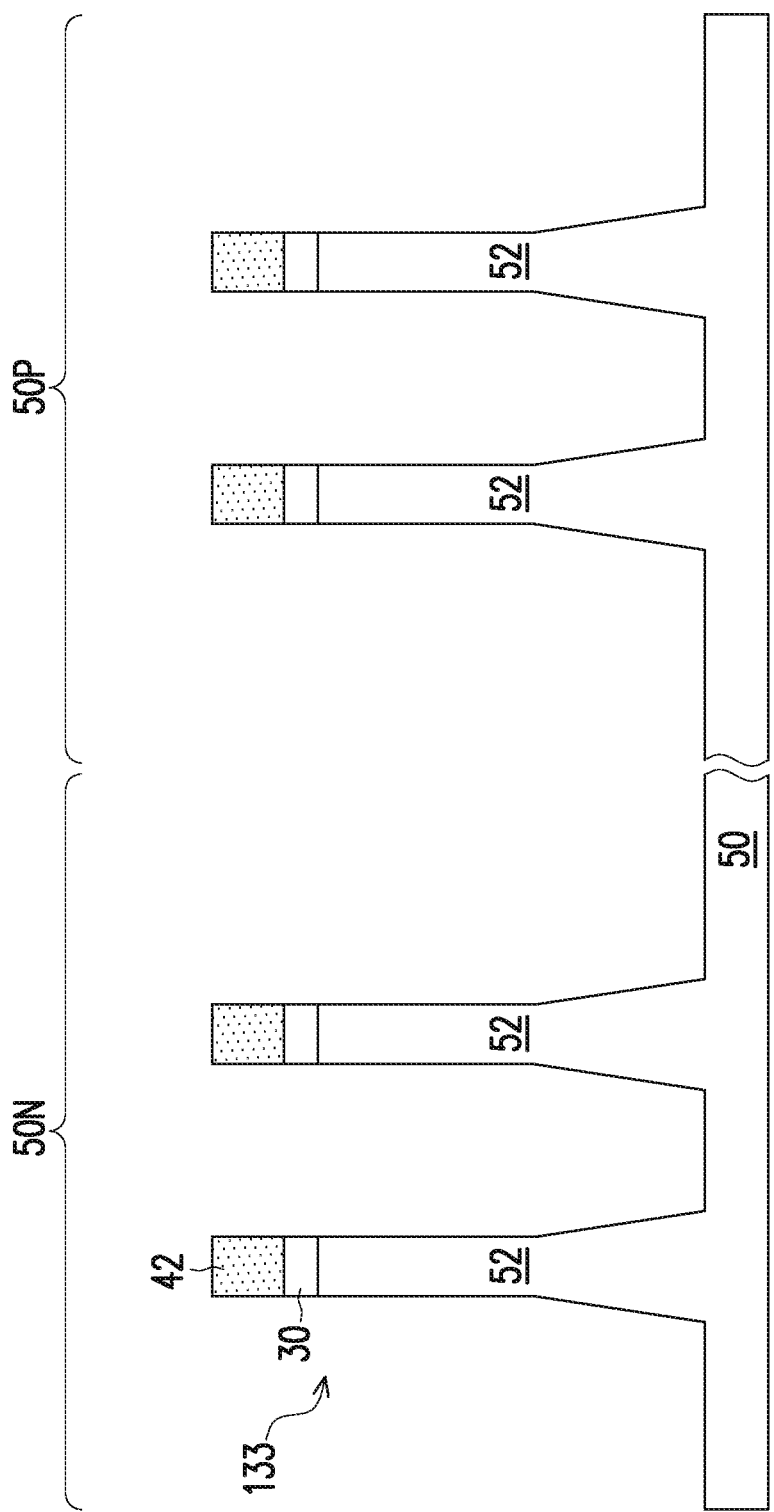
Figure 30:
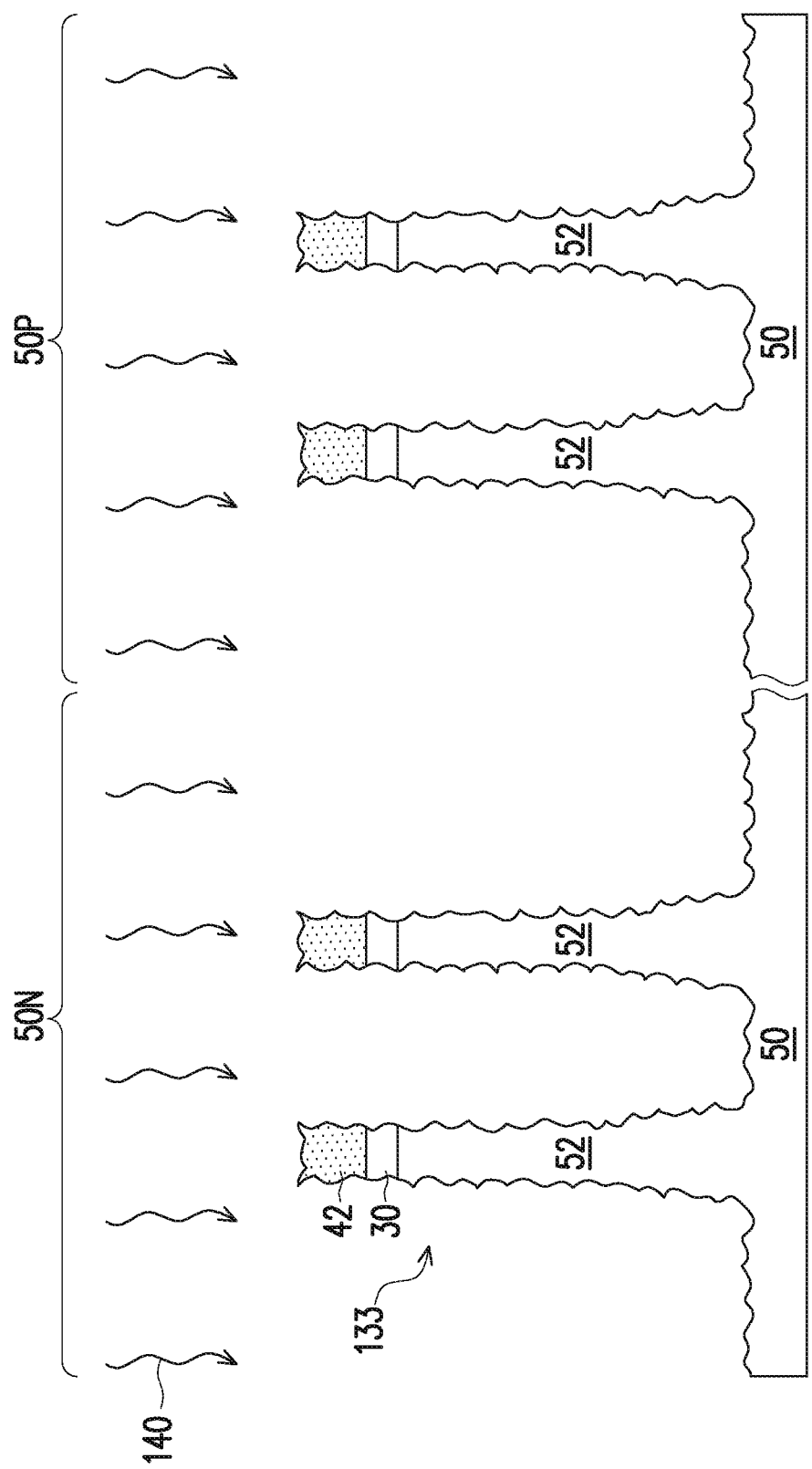

FIG. 29 illustrates fin structures 133, according to an embodiment. The fin structures 133 include a patterned first mask 42 and an ARC 30 formed over fins 52. The fin structures 133 may be similar to the fin structures 53 shown in FIG. 7A or the fin structures 113 shown in FIG. 21 and may be formed in a similar manner. For example, a patterned first mask 42 may be used as an etching mask to etch the substrate 50, similar to the process shown in FIGS. 2-7A. In some embodiments, the patterned first mask 42 may have straight sidewalls, as shown in FIGS. 29-30. In other embodiments, the patterned first mask 42 may have protrusions 43, similar to those described previously with respect to the patterned first mask 42 of the fin structures 53 shown in FIGS. 7A-B.

Figure 31:
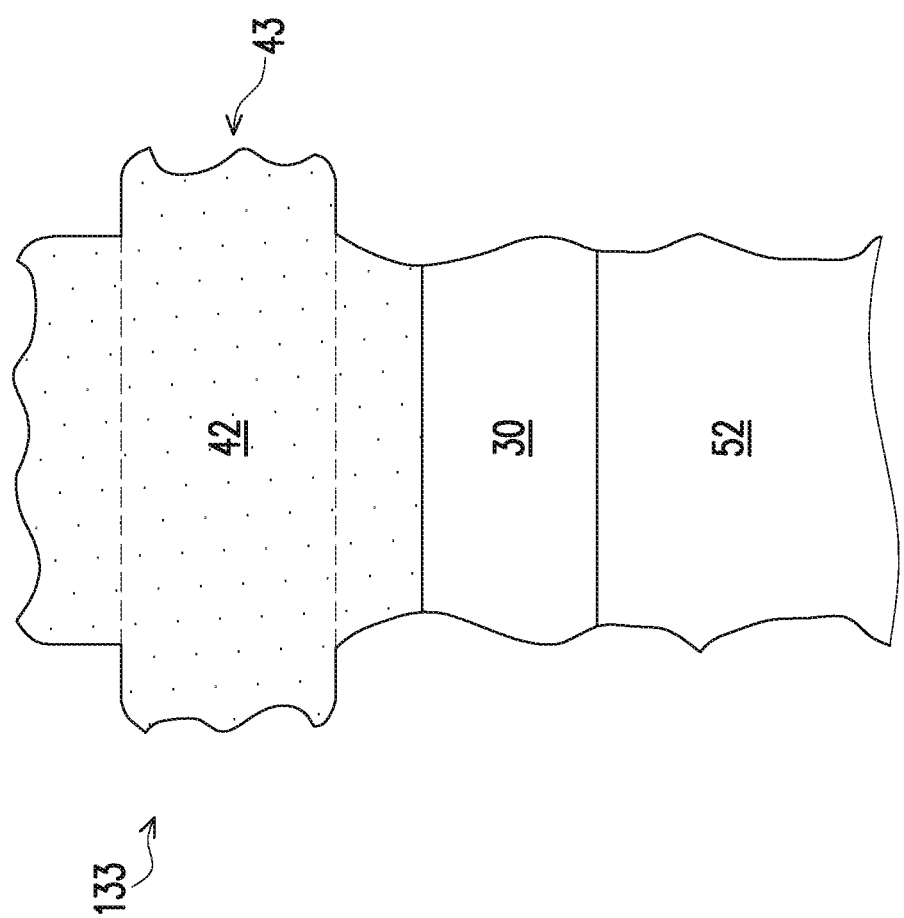

In FIG. 30, a roughening etch 140 is performed to roughen the surfaces of the fin structures 133. The roughening etch 140 may also roughen surfaces of the substrate 50. After performing the roughening etch 140, the rougher surfaces of the fin structures 133 provide less contact area. Thus, due to performing the roughening etch 140 on the fin structures 133, the chance is reduced of the fin structures 133 collapsing due to adhesion forces. In some embodiments, the patterned first mask 42 may be formed having protrusions 43 (see FIGS. 7A-B) in addition to the use of the roughening etch 140, which may further reduce the chance of the fin structures 133 collapsing. As an illustrative example, FIG. 31 shows a close-up view of an embodiment fin structure 133 having a patterned first mask 42 with protrusions 43, in which the fin structure 133 has roughened surfaces due to the roughening etch 140.

In some embodiments, the roughening etch 140 may be performed using a dry etching process, such as a plasma etching process. The process gases used during the dry etching may include $CF_4$, $CHF_3$, $CH_2F_2$, $CH_3F$, $SF_6$, $NF_3$, Ar, $O_2$, the like, or combinations thereof. The process gases may be flowed into a process chamber at a flow rate between about 5 sccm and about 100 sccm. In some embodiments, the roughening etch 140 may be performed using a process pressure between about 1 mTorr and about 100 mTorr. In some embodiments, the roughening etch 140 may be performed using a process temperature between about 25° C. and about 300° C. In an embodiment, the roughening etch 140 includes a process bias voltage between about 10 V to about 500 V. In an embodiment, the roughening etch 140 is performed with a power of from about 100 watts to about 1400 watts. In embodiments, the amount of roughness on the fin structures 133 that the roughening etch 140 produces may be controlled by controlling the etchant gases, bias voltage, or other process characteristics of the roughening etch 140. In some embodiments, the amount of roughness produced by the roughening etch 140 may be increased by increasing the flow rate of a process gas. For example, increasing the flow rate of an etching gas (e.g., $SF_6$) can increase the sidewall etching rate and cause the sidewalls to have a rougher profile or a "scalloped" profile.

Figure 32:
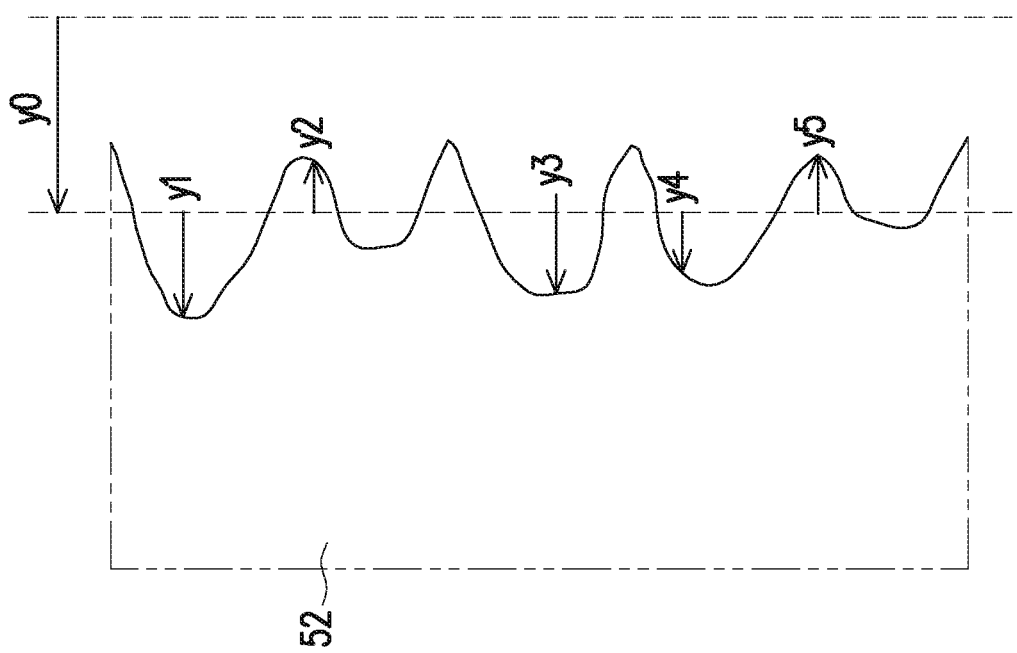

FIG. 32 shows a close-up view of a portion of a sidewall of a fin 52 of a fin structure 133 after the roughening etch 140 has been performed. As shown in FIG. 32, the roughening etch 140 etches into the surface of the fin structure 133 an average etch distance $y_0$. In some embodiments, the roughening etch 140 may etch into a surface of the fin structure 133 an average distance between about 5 nm and about 50 nm. The roughness Rq of the roughened surface of the fin structure 133 may be characterized by the root mean square (RMS) of the distance between the average etch distance $y_0$ and points $y_1$ on the roughened surface of the fin structure 133, measured in a direction parallel to the average etch distance $y_0$. An expression for the roughness Rq using n points on the roughened surface of the fin structure 133 is shown in FIG. 32, and example points $y_1$-$y_5$ on the roughened surface are also shown. The roughness Rq may be determined using more or fewer points than the number shown in FIG. 32. In some embodiments, the roughness Rq of a roughened surface of the fin structure 133 may be between about 0.5 nm and about 20 nm. In some cases, the chance of fin structure 1333 collapse may be reduced more effectively by performing the roughening etch 140 such that surfaces of the fin structures 133 have a roughness Rq that is at least 0.5 nm.

Figure 33:
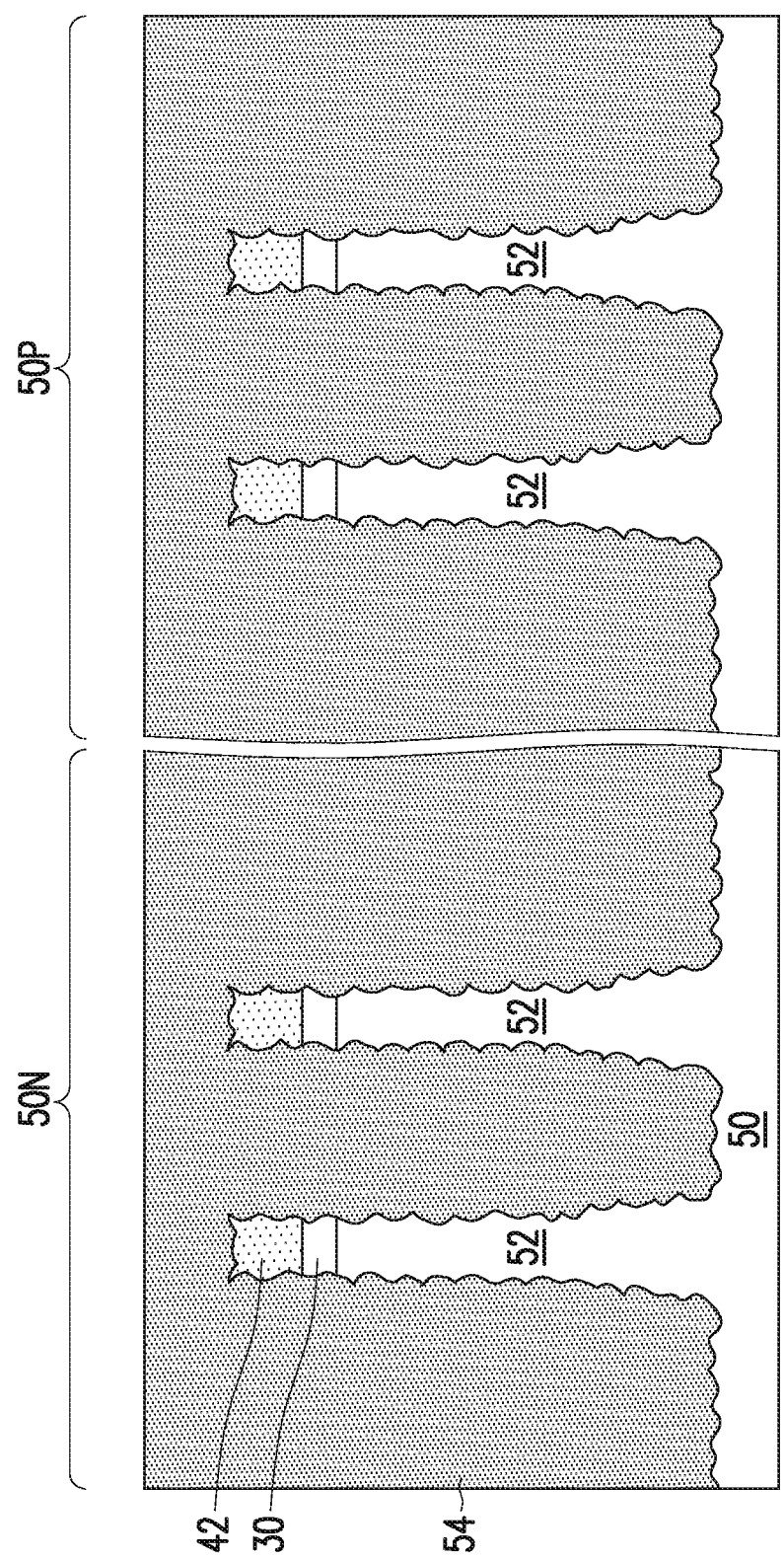

FIGS. 33 through 36B illustrate subsequent intermediate stages in the manufacturing of FinFETs following FIG. 30, in accordance with some embodiments. The processing steps shown in FIGS. 33 through 36B may be similar to steps shown above in FIGS. 8 through 20B or FIGS. 25 through 28B. In FIG. 33, an insulation material 54 is formed over the fin structures 133, including over the substrate 50 and between neighboring fin structures 133. The insulation material 54 may be similar to the insulation material 54 described previously in FIG. 8. For example, the insulation material 54 may be an oxide, such as silicon oxide, a nitride, the like, or a combination thereof, and may be formed by HDP-CVD, CVD, FCVD, the like, or a combination thereof. Other insulation materials formed by any acceptable process may be used. In an embodiment, the insulation material 54 is formed such that excess insulation material 54 covers the fin structures 133. Although the insulation material 54 is illustrated as a single layer, some embodiments may utilize multiple layers.

Figure 34:
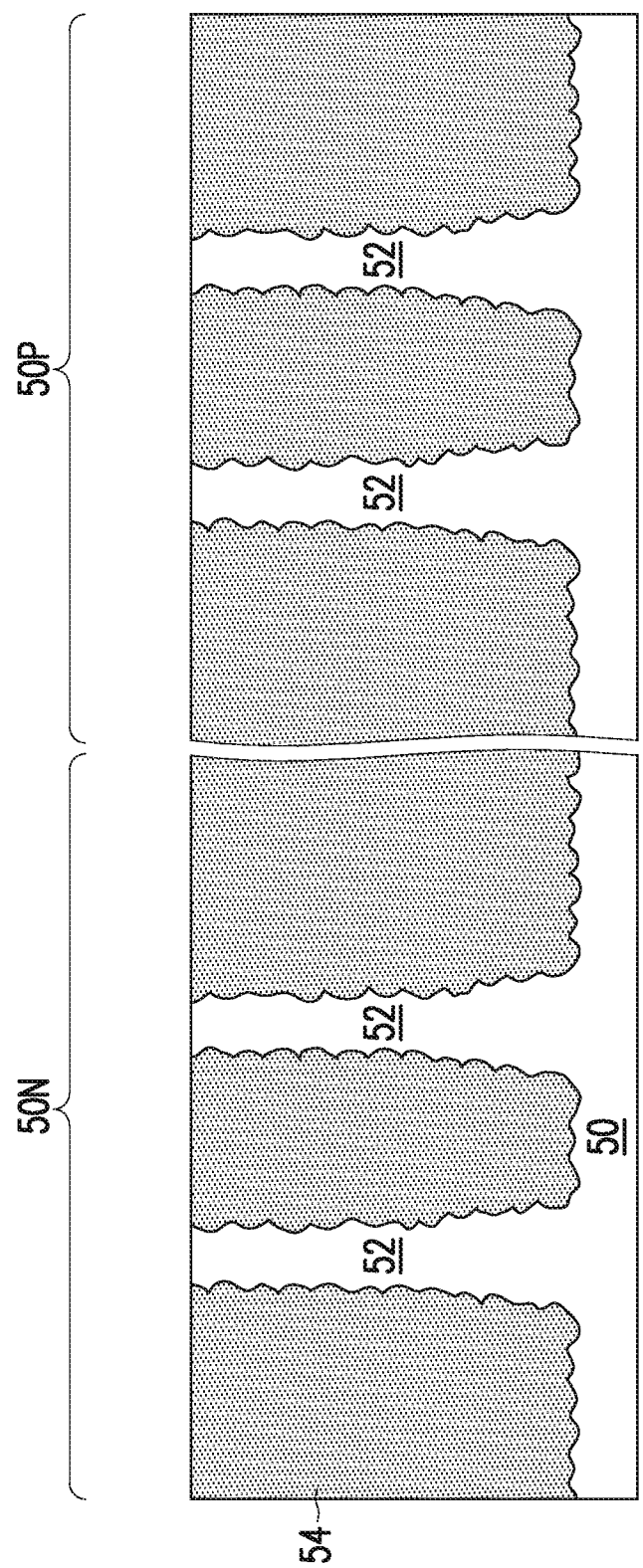

In FIG. 34, a removal process is applied to the insulation material 54 to remove excess insulation material 54 over the fins 52. The ARC 30 and patterned first mask 42 may also be removed. In some embodiments, a CMP, an etch back process, combinations thereof, or the like may be utilized. The planarization process exposes the fins 52 such that top surfaces of the fins 52 and surfaces of the insulation material 54 are level after the planarization process is complete.

Figure 35:
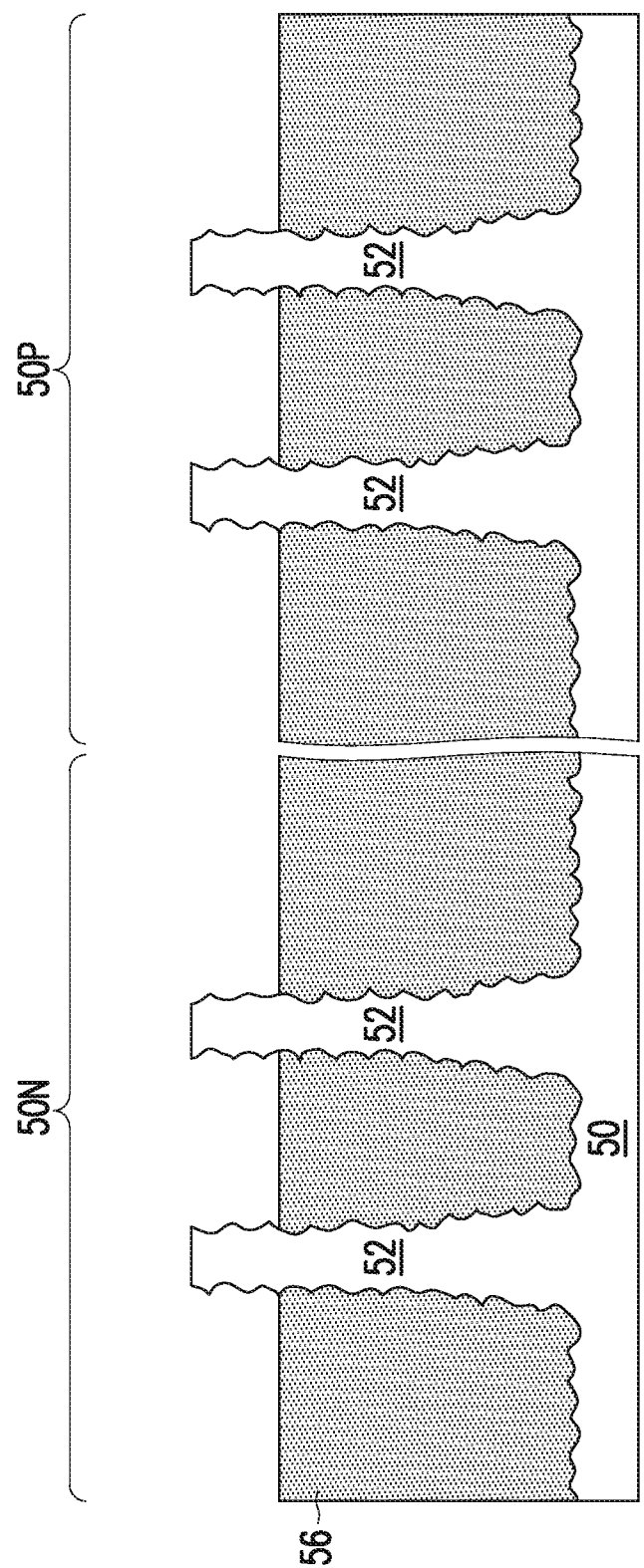

In FIG. 35, the insulation material 54 is recessed to form STI regions 56. The insulation material 54 is recessed such that upper portions of fins 52 in the region 50N and in the region 50P protrude from between neighboring STI regions 56. The STI regions 56 may be similar to those described previously in FIG. 10. The STI regions 56 may be recessed using an acceptable etching process, such as one that is selective to the material of the insulation material 54 (e.g., etches the material of the insulation material 54 at a faster rate than the material of the fins 52). For example, a chemical oxide removal with a suitable etch process using, for example, dilute hydrofluoric (dHF) acid may be used. Further in FIG. 35, appropriate wells (not shown) may be formed in the fins 52 and/or the substrate 50, which may be similar to those described previously with respect to FIG. 10. In some embodiments, a P well may be formed in the region 50N, and an N well may be formed in the region 50P. In some embodiments, a P well or an N well are formed in both the region 50N and the region 50P.

FIGS. 36A-B illustrate cross-sectional views of FinFETs, in accordance with some embodiments. FIGS. 36A-B illustrate features in either of the region 50N and the region 50P. The FinFETs shown in FIGS. 36A-B may be formed subsequent to the structure shown in FIG. 35. In some embodiments, the FinFETs shown in FIGS. 36A-B may be formed having features and using process steps similar to those described above with respect to FIGS. 11 through 20B. For example, a dummy gate structure and gate spacers may be formed over the fins 52, and epitaxial source/drain regions 82 may be formed in the fins 52. A first ILD 88 may be formed over the fins 52 and epitaxial source/drain regions 82, and the dummy gate structure may be replaced by a gate stack including gate electrodes 94 and gate dielectric layers 92. A second ILD 108 may be formed over the first ILD 88, and then gate contacts 110 and source/drain contacts 112 may be formed through the second ILD 108 and the first ILD 88.

Some embodiments may achieve advantages. Embodiments described herein may decrease the contact area of fins or fin structures of a FinFET in order to reduce the chance of collapse or similar process failures due to adhesion forces (e.g., "stiction"). In some embodiments, the contact area may be reduced by forming a patterned mask over the fins that has convex sidewalls or sidewalls including lateral protrusions. In some embodiments, a film having a rough surface may be formed over the fins or fin structures. In some embodiments, an etching process may be performed to roughen the surfaces of the fins or fin structures. In some embodiments, some or all of these techniques may be combined to further reduce the chance of collapse. By reducing the chance of collapse or similar failures, the yield of the process may be improved. Additionally, the use of techniques described herein may allow for smaller fin sizes without increasing the risk of process failures due to adhesion forces.

In an embodiment, a method includes depositing a mask layer over a semiconductor substrate, etching the mask layer to form a patterned mask, wherein a sidewall of the patterned mask includes a first sidewall region, a second sidewall region, and a third sidewall region, wherein the first sidewall region is farther from the semiconductor substrate than the second sidewall region and the second sidewall region is farther from the semiconductor substrate than the third sidewall region, wherein the second sidewall region protrudes laterally from the first sidewall region and from the third sidewall region, etching the semiconductor substrate using the patterned mask to form fins, forming a gate stack over the fins, and forming source and drain regions in the fin adjacent the gate stack. In an embodiment, the method further includes depositing a polysilicon layer over the patterned mask and over the fins, forming an isolation region surrounding the fins, and removing the patterned mask. In an embodiment, depositing the polysilicon layer includes a process temperature between 500° C. and 900° C. In an embodiment, the second sidewall region protrudes laterally from the first sidewall region a lateral distance between 2 nm and 30 nm. In an embodiment, the mask layer includes silicon nitride. In an embodiment, the method further includes depositing an oxide layer on the semiconductor substrate, wherein the mask layer is deposited on the oxide layer. In an embodiment, the first sidewall region has a first width between 5 nm and 50 nm and the second sidewall region has a second width between 7 nm and 80 nm. In an embodiment, etching the mask layer includes performing a first dry etch process to partially recess the mask layer, after performing the first dry etch process, depositing a passivation layer over the mask layer, and after depositing the passivation layer, performing a second dry etch process. In an embodiment, the method further includes performing an etching process on the patterned mask and the fins, wherein surfaces of the patterned mask and surfaces of the fins are rougher after performing the etching process than before performing the etching process.

In an embodiment a method includes patterning a substrate to form a semiconductor strip having a first roughness, performing an etching process on the semiconductor strip, wherein after the etching process the semiconductor strip has a second roughness that is greater than the first roughness, forming a dummy gate stack over a channel region of the semiconductor strip, forming gate spacers on sidewalls of the dummy gate stack, and epitaxially growing a source/drain region adjacent the channel region. In an embodiment, the method includes depositing a film on sidewalls of the semiconductor strip, wherein surfaces of the film have a third roughness greater than the first roughness. In an embodiment, the etching process includes a dry etch using $SF_6$ as a process gas. In an embodiment, the second roughness has a root mean square (RMS) value between 0.5 nm and 20 nm. In an embodiment, patterning the substrate includes forming a patterned mask on the substrate and wherein performing the etching process further includes performing the etching process on the patterned mask. In an embodiment, the patterned mask has convex sidewalls.

In an embodiment, a semiconductor device includes a fin extending from an upper surface of a substrate, the sidewalls of the fin having a first roughness, a film extending along sidewalls of the fin, the film having a second roughness that is greater than the first roughness, a gate stack disposed over the film and the fin, and an epitaxy region disposed adjacent the fin. In an embodiment, the film extends along the upper surface the substrate. In an embodiment, the film includes polysilicon. In an embodiment, the polysilicon has an average grain size between 0.5 nm and 20 nm. In an embodiment, the second roughness has a root mean square (RMS) value between 0.5 nm and 20 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a fin extending from an upper surface of a substrate, wherein the fin comprises a first material, wherein the sidewalls of the fin have a first roughness;
   a film extending along the sidewalls of the fin, wherein the film comprises a second material, wherein outer surfaces of the film have a second roughness that is greater than the first roughness, wherein the film extends along an upper surface of the substrate;
   a gate stack over the film and the fin, wherein the gate stack comprises a gate dielectric layer; and
   an epitaxy region on the fin, wherein the epitaxy region is adjacent the gate stack.

2. The semiconductor device of claim 1, wherein the top surface of the fin is free of the film.

3. The semiconductor device of claim 1, wherein the second material is different than the first material.

4. The semiconductor device of claim 1, wherein the second material is polysilicon.

5. The semiconductor device of claim 4, wherein the polysilicon has an average grain size in the range of 0.5 nm to 20 nm.

6. The semiconductor device of claim 1, wherein the second roughness has a root mean square (RMS) value in the range of 0.5 nm to 20 nm.

7. The semiconductor device of claim 1, wherein the film has an average thickness in the range of 5 nm to 50 nm.

8. The semiconductor device of claim 1, wherein a top surface of the film is level with a top surface of the fin.

9. The semiconductor device of claim 1 further comprising an isolation region surrounding the fin, wherein the isolation region extends over a portion of the film.

10. A device comprising:
- a first fin protruding from a semiconductor substrate;
- a second fin protruding from the semiconductor substrate, wherein the second fin is adjacent the first fin;
- a roughening layer extending along a first sidewall surface of the first fin, along a second sidewall surface of the second fin, and over the semiconductor substrate, wherein the roughening layer has a root mean square (RMS) roughness value of at least 0.5 nm;
- an isolation region on the roughening layer, wherein the isolation region surrounds the first fin and surrounds the second fin;
- a gate stack over the first fin, along the first sidewall surface, over the second fin, and along the second sidewall surface; and
- a first epitaxial source/drain region on the first fin adjacent the gate stack and a second epitaxial source/drain region on the second fin adjacent the gate stack.

11. The device of claim 10, wherein the gate stack physically contacts the roughening layer along the first sidewall surface and along the second sidewall surface.

12. The device of claim 10, wherein the gate stack physically contacts top surfaces of the first fin and the second fin.

13. The device of claim 10, wherein the roughening film extending along the first sidewall surface and along the second sidewall surface protrudes above the isolation region.

14. The device of claim 10, wherein the material of the roughening film is different from the material of the isolation region.

15. The device of claim 10, wherein the material of the roughening film is polysilicon.

16. The device of claim 10, wherein the roughening layer extends continuously from the first sidewall surface to the second sidewall surface.

17. The device of claim 10, wherein the wherein the first sidewall surface and the second sidewall surface have a root mean square (RMS) roughness value of less than 0.5 nm.

18. A device comprising:
- a semiconductor fin over a substrate, wherein a top surface of the semiconductor fin protrudes a first height above a top surface of the substrate;
- a polysilicon layer extending on the semiconductor fin from the top surface of the substrate to the first height;
- an isolation region surrounding the semiconductor fin and the polysilicon layer; and
- a gate structure over the semiconductor fin and on upper surfaces of the polysilicon layer.

19. The device of claim 18, wherein the polysilicon layer has an average grain size in the range of 0.5 nm to 20 nm.

20. The device of claim 18, wherein the polysilicon layer extends on the top surface of the substrate.

* * * * *